(12) United States Patent
Higashikawa et al.

(10) Patent No.: US 6,645,573 B2
(45) Date of Patent: *Nov. 11, 2003

(54) PROCESS FOR FORMING A MICROCRYSTALLINE SILICON SERIES THIN FILM AND APPARATUS SUITABLE FOR PRACTICING SAID PROCESS

(75) Inventors: Makoto Higashikawa, Kyotanabe; Masafumi Sano, Kyoto-fu, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/261,499

(22) Filed: Mar. 3, 1999

(65) Prior Publication Data

US 2001/0019746 A1 Sep. 6, 2001

(30) Foreign Application Priority Data

Mar. 3, 1998 (JP) .......................................... 10-050321

(51) Int. Cl.[7] ................................................ H05H 1/24
(52) U.S. Cl. ...................................... 427/569; 427/578
(58) Field of Search ................................. 427/569, 578

(56) References Cited

U.S. PATENT DOCUMENTS

| | | | |
|---|---|---|---|
| 4,400,409 A | | 8/1983 | Izu et al. |
| 4,492,736 A | * | 1/1985 | Tanner ........................ 427/578 |
| 4,585,537 A | * | 4/1986 | Nakayama et al. ......... 204/192 |
| 4,600,801 A | * | 7/1986 | Guha et al. .................... 427/74 |
| 4,920,917 A | * | 5/1990 | Nakatani et al. ............. 118/718 |
| 5,362,684 A | * | 11/1994 | Saito et al. .................. 427/575 |
| 5,652,029 A | | 7/1997 | Itoh |
| 5,677,236 A | * | 10/1997 | Saitoh et al. ............... 427/578 |
| 5,720,826 A | * | 2/1998 | Hayashi et al. ............. 427/575 |
| 5,766,696 A | | 6/1998 | Itoh |
| 6,025,039 A | * | 2/2000 | Yajima ........................ 427/573 |
| 6,065,425 A | | 5/2000 | Takaki et al. |
| 6,100,466 A | * | 8/2000 | Nishimoto ................... 427/588 |

FOREIGN PATENT DOCUMENTS

| | | |
|---|---|---|
| JP | 57 195737 | 5/1981 |
| JP | 59 212176 | 5/1983 |
| JP | 59-213176 | 12/1984 |
| JP | 57710 | 12/1987 |
| JP | 3-6466 | 1/1991 |
| JP | 2575397 | 1/1997 |
| JP | 9-256160 | 9/1997 |

OTHER PUBLICATIONS

R. Flückiger, et al., Preparation Of Undoped And Doped Microcrystalline Silicon ($\mu c$–Si:H) By VHR–GF For P–I–N Solar Cells, 23° IEEE Photovoltaic Specialists Conference, 1993 (pp. 839–844).

* cited by examiner

Primary Examiner—Bret Chen
(74) Attorney, Agent, or Firm—Fitzpatrick, Cella, Harper & Scinto

(57) ABSTRACT

A process for forming a microcrystalline silicon series thin film by arranging a long substrate in a vacuum chamber so as to oppose an electrode provided in the vacuum chamber and while transporting the long substrate in a longitudinal direction, causing glow discharge between the electrode and the long substrate to deposit the microcrystalline silicon series thin film on the long substrate, wherein a plurality of bar-like shaped electrodes as the electrode are arranged such that they are perpendicular to a normal line of the long substrate and their intervals to the long substrate are all or partially different. The glow discharge is caused using a high frequency power with an oscillation frequency in a range of from 50 MHz to 550 MHz, whereby depositing the microcrystalline series thin film on the long substrate. An apparatus suitable for practicing the process is included.

5 Claims, 13 Drawing Sheets

F I G. 10
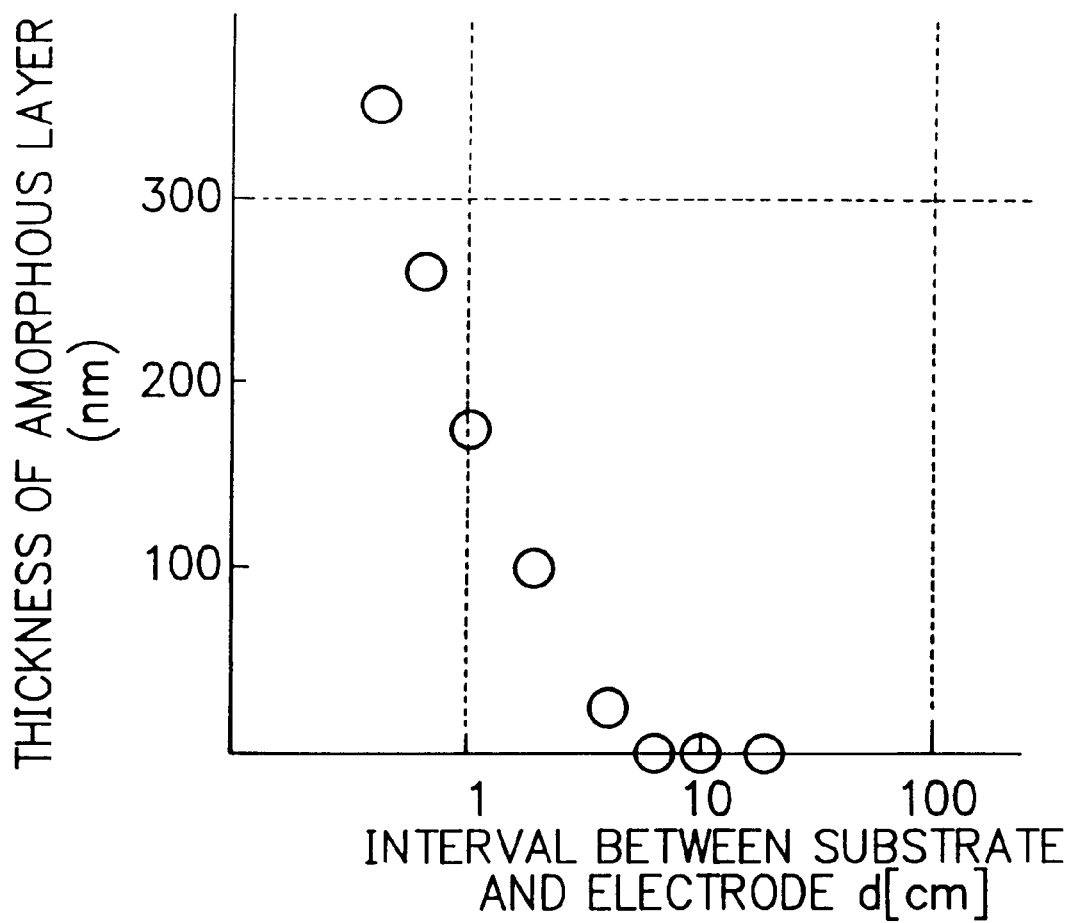

F I G. 13
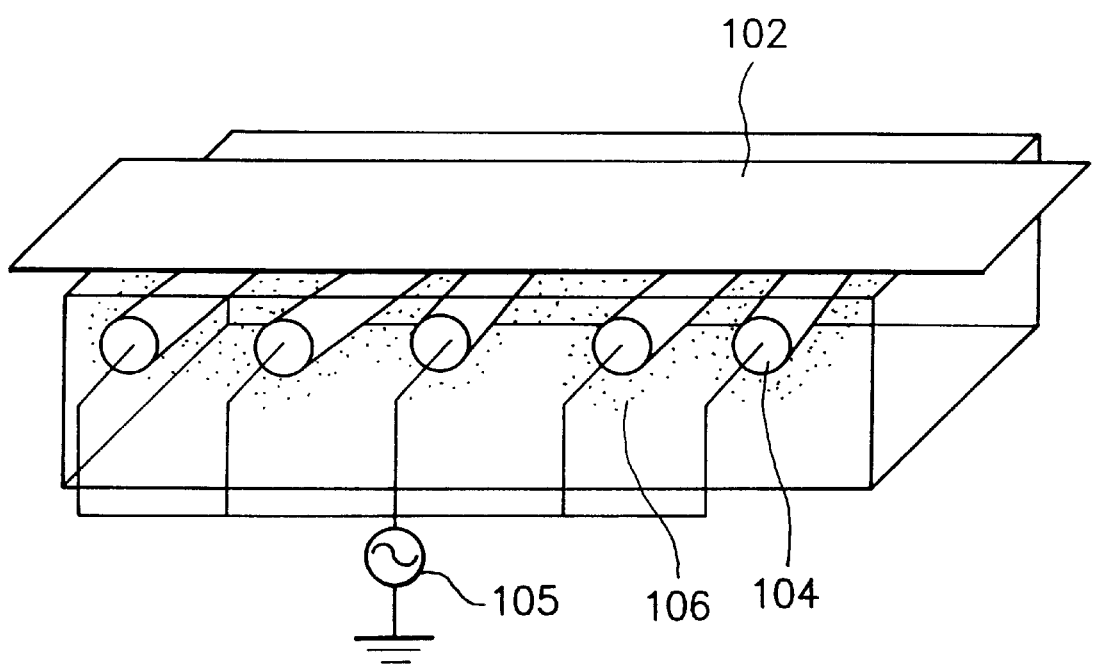

PROCESS FOR FORMING A MICROCRYSTALLINE SILICON SERIES THIN FILM AND APPARATUS SUITABLE FOR PRACTICING SAID PROCESS

BACKGROUND OF THE INVENTION

1. Field of the Invention

The present invention relates a process for forming a microcrystalline silicon series thin film (this film will be hereinafter referred to as "μc-silicon series thin film" or "μc-Si series thin film") and an apparatus suitable for practicing said process. More particularly, the present invention relates to a process and an apparatus which enable one to form a highly reliable μc-Si series thin film having a large area and a high energy conversion efficiency which is usable in the production of semiconductor devices such as electrophotographic light receiving members (or electrophotographic photosensitive members), image input line sensors, image pickup devices, photovoltaic devices (including solar cells), and the like.

2. Related Background Art

Hitherto, solar cells comprising a photovoltaic element which converts sunlight into electric energy have been widely using as a small power source in daily appliances such as electronic calculators, wrist watches, and the like. Such a solar cell is expected to provide a practically usable power generation source which can replace the power generation source based on fossil fuels such as petroleum.

Incidentally, in a solar cell the photoelectromotive force of a pn junction is used in the functional portion. In general, the pn junction is constituted by a semiconductor material such as a semiconductor silicon material or a semiconductor germanium material. The semiconductor functions to absorb sunlight and generate photocarriers of electrons and holes, where the photocarriers drift due to an internal electric field of the pn junction, followed by being outputted to the outside.

Now, in view of the efficiency of converting light energy into electricity, it is preferred to use a single crystalline silicon material. However, crystalline silicon materials including a single crystalline silicon material have an indirect optical end, and therefore, they are small in light absorption. In this connection, in the case of a solar cell in which a single crystalline silicon is used (this solar cell will be hereinafter referred to as "single crystal solar cell"), it is necessary for the single crystal solar cell to have a thickness of at least 50 μm in order for the solar cell to sufficiently absorb incident sunlight. In this case, if the single crystalline silicon material is replaced by a polycrystalline silicon material in order to diminish the production cost of the solar cell, the problem of the above indirect optical end cannot be solved unless the thickness is increased. The polycrystalline silicon material has problems such as grain boundaries and others.

In view of attaining a large area and a reasonable production cost for a solar cell, a so-called thin film silicon solar cell which is represented by an amorphous silicon solar cell having a semiconductor layer comprising an amorphous silicon thin film produced by way of CVD (chemical vapor phase deposition) has been evaluated as being more advantageous. In fact, currently, amorphous silicon solar cells have been widely used as a small power source in daily appliances. However, in order for such a amorphous silicon solar cell to be used as an ordinary power generation source, the photoelectric conversion efficiency and must be improved the performance stabilized.

A solar cell in which a microcrystalline silicon (a μc-silicon) as a carrier generation layer has been proposed (see, A. Shah et al., 23th IEEE Photovoltaic Specialist Cont. (1993), p. 839).

The most popular film-forming method for depositing such μc-silicon series thin film or amorphous silicon thin film is a plasma CVD process. In the plasma CVD process, the formation of a μc-silicon series thin film or an amorphous silicon thin film is conducted, for instance, in the following manner., That is, a film-forming raw material gas such as silane ($SiH_4$) or disilane ($Si_2H_6$) is introduced into a reaction chamber in which a substrate on which a film is to be deposited is arranged, if necessary, while being diluted by hydrogen gas ($H_2$), a high frequency power with an oscillation frequency of 13.56 MHz in an RF band region is supplied in the reaction chamber to generate plasma whereby decomposing the film-forming raw material gas to produce reactive active species having, resulting in depositing a μc-silicon thin film or an amorphous silicon thin film on the substrate. In the case where the film formation is conducted by mixing a doping gas such as phosphine ($PH_3$), diborane ($B_2H_6$) or boron fluoride ($BF_3$) to the film-forming raw material gas, it is possible to form a doped μc-silicon thin film whose conductivity is controlled to n-type or p-type.

However, such μc-silicon thin film has a disadvantage. The photoelectric conversion efficiency of a solar cell in which such μc-silicon thin film is used is lower than that of a crystalline series solar cell. In addition, for the μc-silicon thin film, there is also a disadvantage in that the deposition rate thereof is low.

In general, the formation of a μc-silicon thin film is conducted by using RF glow discharge. However, the μc-silicon thin film thus formed has an indirect optical end as well as in the case of a crystalline silicon thin film, and therefore, its light absorption is small. In this connection, in the case of a μc-silicon solar cell in which a μc-silicon thin film is used, it is necessary for the μc-silicon solar cell to have a thickness of about 5 μm, and therefore, a lot of time is required to produce the μc-silicon solar cell.

Shah describes that the formation of a μc-silicon thin film is conducted using a high frequency power with an oscillation frequency of 70 MHz. The deposition rate in this case is about 1 Å/sec. which is smaller.

With respect to the formation of an amorphous silicon (a-Si) thin film by way of RF plasma CVD, there is a report in that for the high frequency discharge in the RF band region hitherto, discussion has been made by raising the oscillation frequency has been discussed. Particularly, in the Applied Physics-related joint lecture meetings of 1990 Autumn and 1991 Spring (28p-MF-14 and 28p-S-4), Oda et al. of Tokyo Institute of Technology have reported that amorphous silicon thin films were formed by conducting glow discharge using a high frequency power with an oscillation frequency of 144 MHz (which is of VHF (very high frequency) band region) and the amorphous silicon thin films were evaluated.

Additionally, U.S. Pat. No. 4,400,409 discloses a process of continuously preparing a photovoltaic element by using a continuous plasma CVD apparatus of a roll-to-roll system. This document describes that a plurality of glow discharge regions are separately arranged along the path of a sufficiently long flexible substrate having a desired width which is continuously transported to pass through each of said glow discharge regions, and while forming a desired semiconductor layer on the substrate in each glow discharge region, the substrate is continuously transported, whereby a photovoltaic element having a desired semiconductor junction can be continuously formed.

In the case of forming a µc-silicon series thin film by RF glow discharge using a high frequency power with an oscillation frequency of 13.56 MHz as in the foregoing prior art, the following problems need to be solved or improved.

(1) There are such disadvantages for semiconductor devices in which such µc-silicon thin film are used, because of the basic property of the thin film. That is, in the case of a thin film transistor, the carrier mobility is small. In the case of a photo sensor, its S/N ratio defined by a ratio between light conductivity and that dark conductivity. In the case of a solar cell, its photoconductivity (σp) is small.

(2) With respect to production yield, in the case of a large area semiconductor device in which such µc-silicon series thin film is used, a decrease in the yield is caused due to the distributions and the like of device characteristics which are based on the distributions of film thickness and film quality.

(3) With respect to production cost, in the case of forming a high quality µc-silicon thin film usable in a thin film semiconductor device, the productivity cannot be increased because the deposition rate is small, resulting in an increase in the production cost.

(4) It is difficult for the µc-silicon thin film to have a desired property controlled in the film thickness direction.

Eventually, in order to produce a large area µc-silicon thin film solar cell having improved device characteristics at a high yield and at a reasonable production cost, it is necessary to form a µc-silicon thin film at a high deposition rate while improving the basic property thereof. In addition, it is necessary to realize a method which permits control of properties in the film thickness direction.

In order to attain this object, in the plasma CVD process of 13.56 MHz, improvements in the production conditions such as flow rate of raw material gas, pressure upon film formation, power applied and the like have been generally tried. However, problems are liable to occur as will be described in the following. That is, when the deposition rate is increased, a deposited film becomes amorphous (that is, the film becomes an a-Si film), the amount of in-film hydrogen, which is presumed to deteriorate the property of a µc-silicon thin film, is increased, or foreign matter which causes a reduction in the yield is generated. Specifically, for instance, as the deposition rate is increased, the photoconductivity σp as the basic property of the µc-silicon thin film is decreased. In this connection, in this process of forming a µc-silicon thin film, the deposition rate capable of maintaining desirable device characteristics is in a range of from about 0.2 to about 2 Å/sec.

In the RF glow discharge process, the range for controllable parameters capable of forming a µc-silicon thin film having a good quality is narrow, where it is difficult to control the property of the µc-silicon thin film as desired.

The RF discharge process of 13.6 MHz has an advantage in that film formation on a large area can be readily conducted. However, it has disadvantages such that the deposition rate is small and ion damage to a substrate or a µc-silicon thin film itself deposited thereon is large. In this connection, there is occasionally used a triode process in which a third electrode is provided between an anode and a cathode. However, this process is not suitable in terms of industrial production of a µc-silicon thin film, because the utilization efficiency of raw material gas is undesirably small and the maintenance efficiency is not satisfactory. In this respect, this triode process is used only for research purposes. In addition, in the case of forming a µc-silicon thin film by the triode process, it is difficult to control the property thereof as desired. In the case of forming a µc-silicon thin film by means of a microwave discharge process of 2.54 GHz, although there are advantages such that the deposition rate is relatively large and there is no ion damage to the substrate, there are disadvantages because it is difficult to continuously maintain the glow discharge according to the current technique, and the process controllability is not good. In addition, there are other disadvantages such that gas decomposition at a microwave introduction position is great and therefore, it is difficult to conduct uniform deposition. In the case of a photo CVD process, there are disadvantages such that the quality of a µc-silicon thin film deposited is not good and it is difficult to deposit a µc-silicon thin film on a large area. In addition, the photo CVD process is film-forming technique. For an ECR-CVD process, since it is possible to freely control the ion damage to the substrate, there is a possibility of forming a high quality µc-silicon thin film. But because a magnetic field is used, it is difficult to deposit µc-silicon thin film in an essentially uniform state.

As above described, it is difficult to effectively produce a µc-silicon thin film semiconductor device with good reproducibility by any of the conventional techniques, because it is difficult make the µc-silicon thin film have a high quality to effectively produce a desirable semiconductor device having satisfactory device characteristics; it is difficult to make the µc-silicon thin film have a property controlled n the film thickness direction; and it is difficult to stably and repeatedly form a high quality µc-silicon thin film having a desired property at a high deposition rate and with good reproducibility. In addition to these, the conditions for causing microcrystallization in the prior art are severe, and therefore, it is difficult to stably and repeatedly form a desired µc-silicon thin film.

In the foregoing Applied Physics documents and Japanese Unexamined Patent Publication No. 64466/1991 which describes a similar technique, discussion is made only of amorphous silicon (a-Si) thin film but no discussion is made of microcrystalline silicon (µc-Si) thin films. Shah does not touch on optimum conditions for the formation of a µc-Si thin film and no discussion is made about the control of the property in the film thickness direction. The technique described in Shah is not effective in solving the problem which the present invention is intended to solve.

SUMMARY OF THE INVENTION

A principal object of the present invention is to eliminate the foregoing problems in the prior art and to provide an improved process and apparatus which permits ready and efficient formation of a high quality microcrystalline silicon series (µc-Si series) thin film having a desired property.

Another object of the present invention is to provide a process and apparatus which permits ready and efficiently forming a µc-Si series thin film having a desired property capable of producing a high quality semiconductor device, at an improved film-forming raw material gas utilization efficiency and at a reasonable production cost.

A further object of the present invention is to provide a process for forming a µc-Si series thin film film in which the property thereof in the film thickness direction can be readily controlled while maintaining the film property, so that a high quality µc-Si series thin film having a graded film property in the film thickness direction can be produced.

A further object of the present invention is to provide a process and apparatus which permits production of a high quality μc-Si series thin film semiconductor device at a reasonable production cost.

A further object of the present invention is to provide a process for forming a μc-Si series thin film by arranging a long substrate in a vacuum chamber to oppose an electrode provided in said vacuum chamber and while transporting said long substrate in the longitudinal direction, causing glow discharge between said electrode and the substrate to deposit said μc-Si series thin film on the substrate, wherein a plurality of bar-like shaped electrodes as said electrode are arranged such that they are perpendicular to normal line of said long substrate and their intervals to said long substrate are all or partially differed. Said glow discharge is caused using a high frequency power with an oscillation frequency in a range of from 50 MHz to 550 MHz, whereby depositing said μc-Si series thin film on the substrate.

A further object of the present invention is to provide an apparatus capable forming a μc-Si series thin film on a long substrate, having a portion in which said long substrate is arranged to oppose to an electrode in a vacuum chamber, wherein while transporting said long substrate in the longitudinal direction, glow discharge is caused between the electrode and the substrate to deposit said μc-Si series thin film on the substrate, wherein said apparatus has a plurality of bar-like shaped electrodes as said electrode which are arranged such that they are perpendicular to a normal line of said long substrate and their intervals to said long substrate are all or partially differed. A high frequency power source for causing said glow discharge using a high frequency power with an oscillation frequency in a range of from 50 MHz to 550 MHz is used.

BRIEF DESCRIPTION OF THE DRAWINGS

FIG. 10 is a graph showing an example of a relationship between a thickness of an amorphous layer formed and an interval between a substrate and an electrode.

FIGS. 11, 12, 13, 16, 17, 18 and 20 are schematic cross-sectional slant views respectively for explaining an example of arranging relationship of a substrate and an electrode.

DESCRIPTION OF THE INVENTION AND PREFERRED EMBODIMENTS

Figure 1:
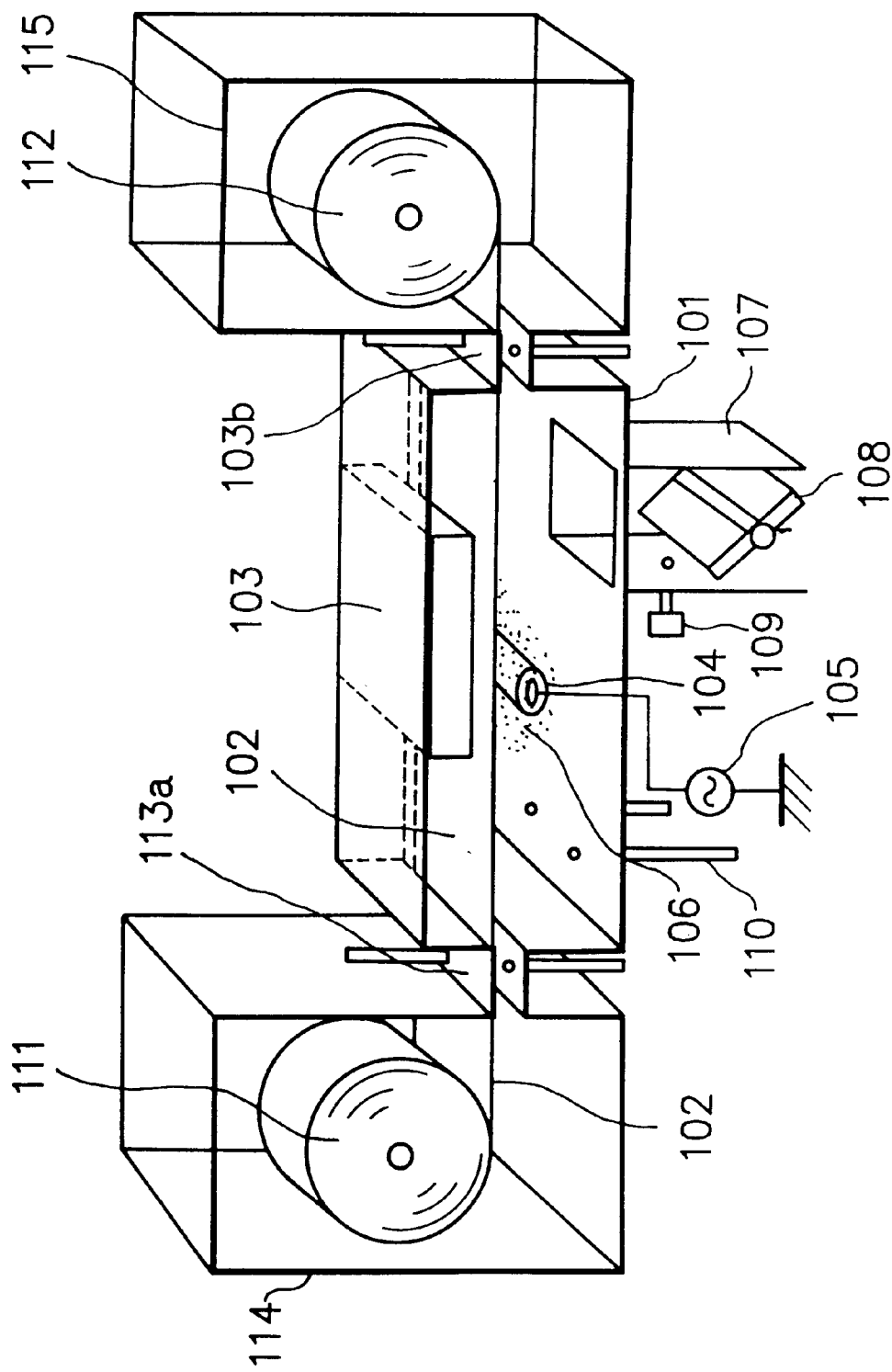
FIG. 1 is a schematic diagram illustrating an example of a film-forming apparatus of a roll-to-roll system.
Figure 2:
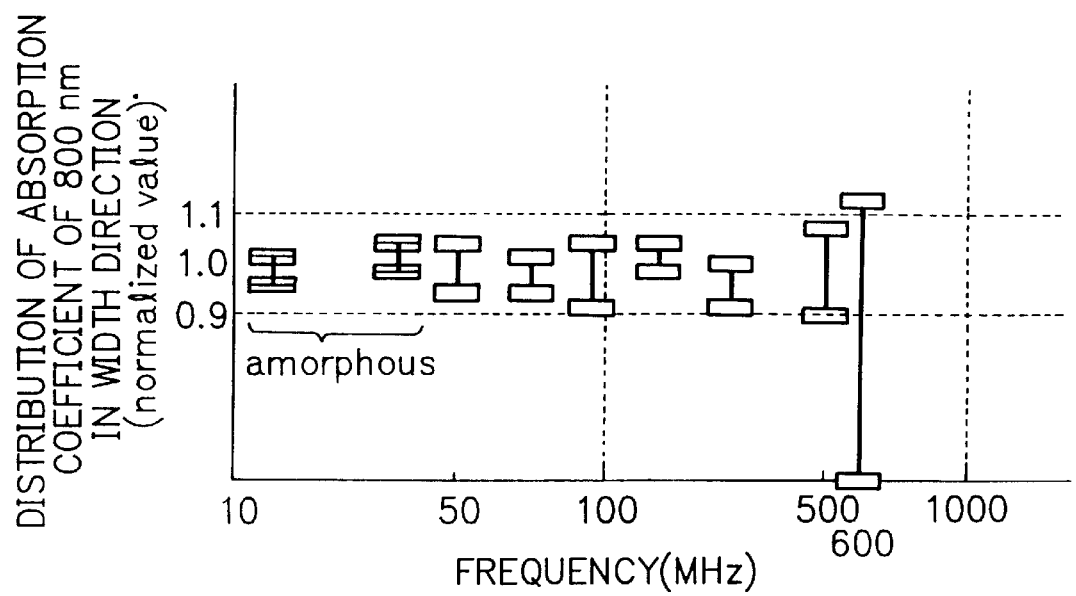
FIG. 2 is a view showing an example of distribution of absorption coefficient in a width direction.
Figure 3:
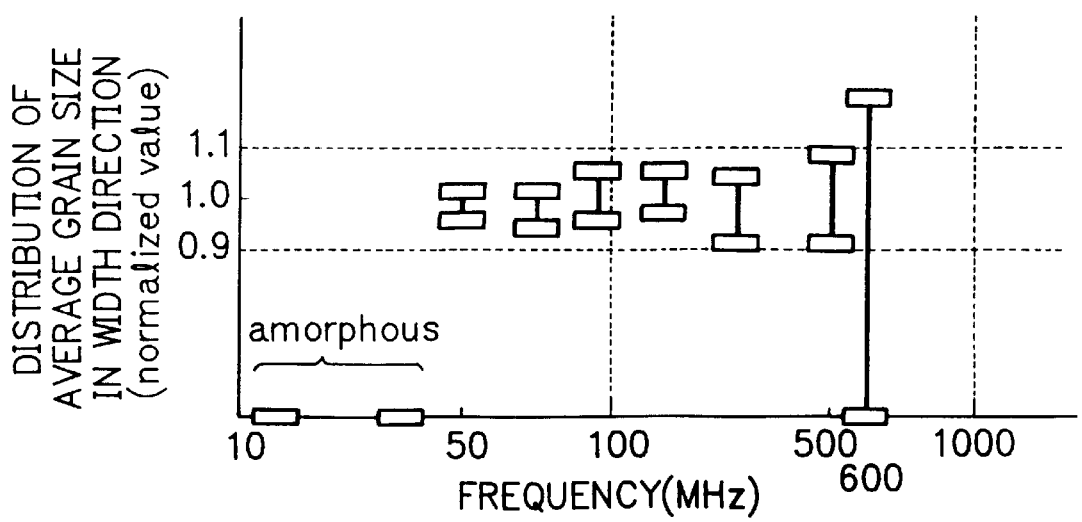
FIG. 3 is a view showing an example of distribution of average grain size in a width direction.
Figure 4:
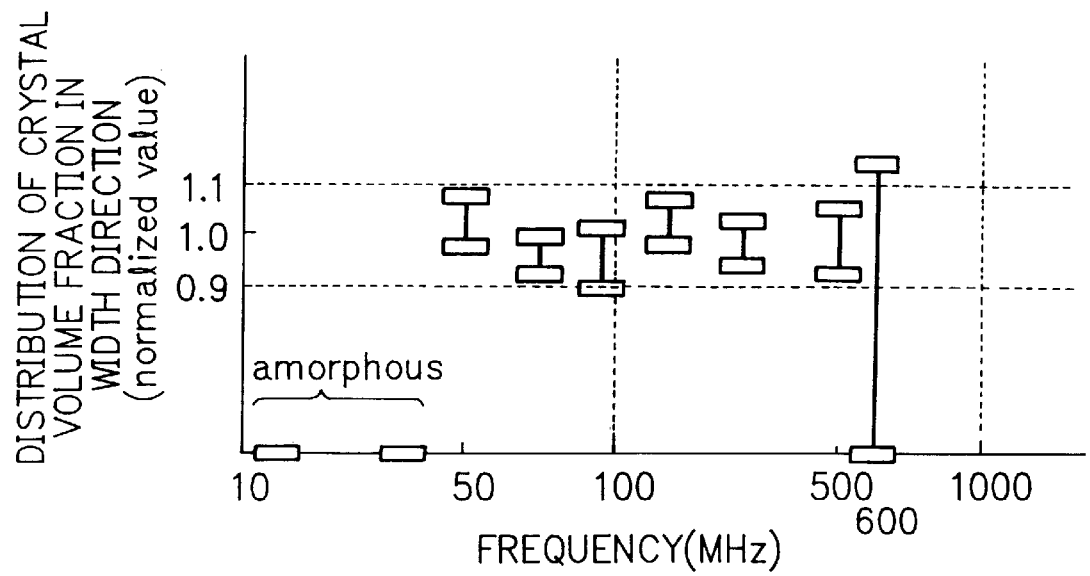
FIG. 4 is a view showing an example of distribution of crystal volume fractions in a width direction.
Figure 5:
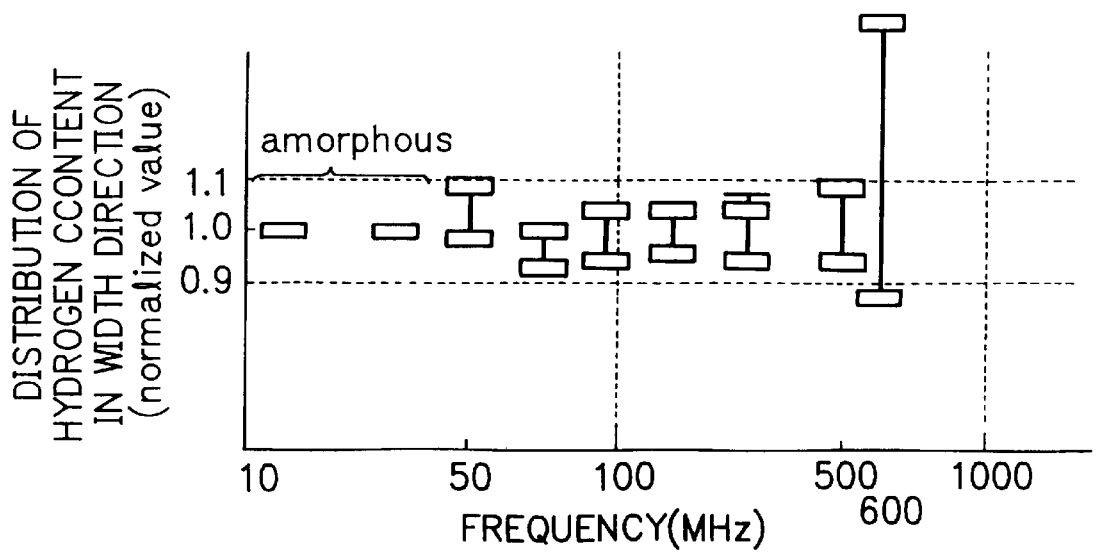
FIG. 5 is a view showing an example of distribution of hydrogen content in a width direction.
Figure 6:
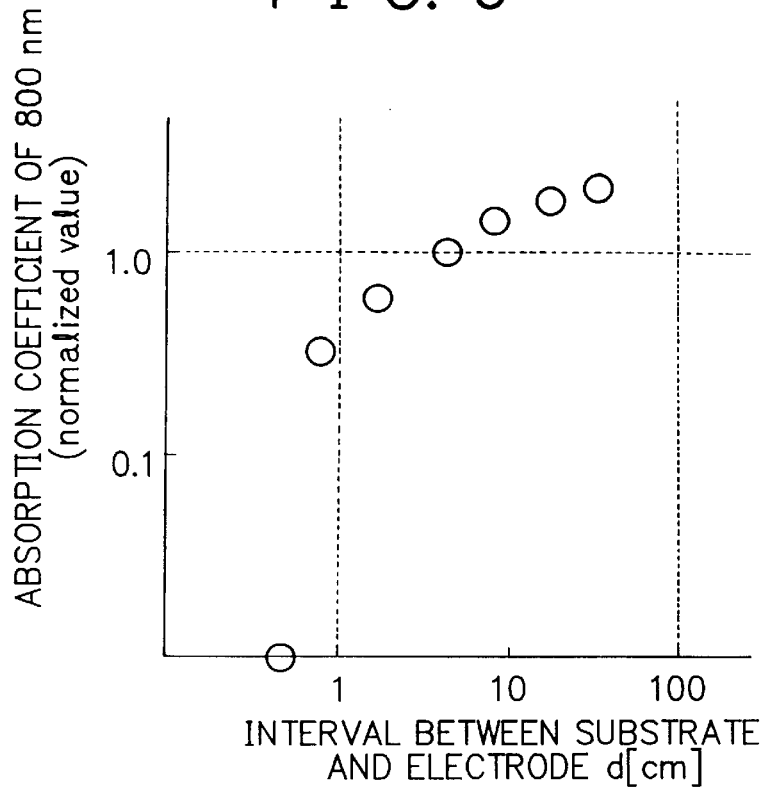
FIG. 6 is a graph showing an example of a relationship between absorption coefficient to light having a wavelength of 800 nm and an interval between a substrate and an electrode.
Figure 7:
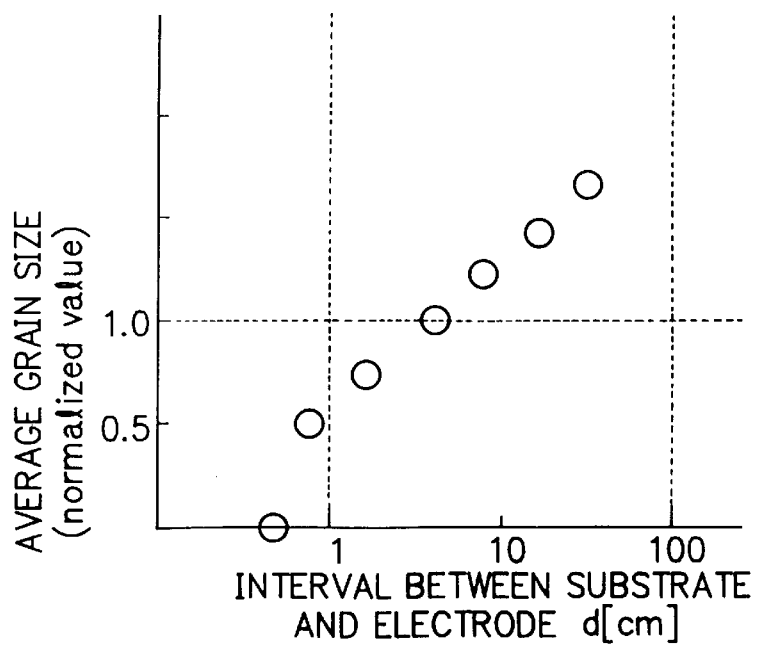
FIG. 7 is a graph showing an example of a relationship between average crystal grain size and an interval between a substrate and an electrode.
Figure 8:
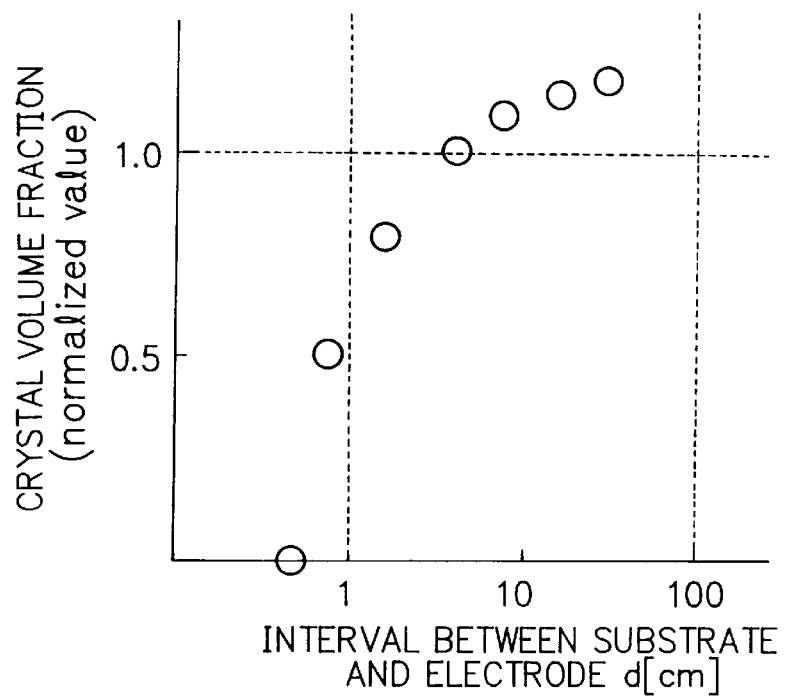
FIG. 8 is a graph showing an example of a relationship between crystal volume fraction and an interval between a substrate and an electrode.
Figure 9:
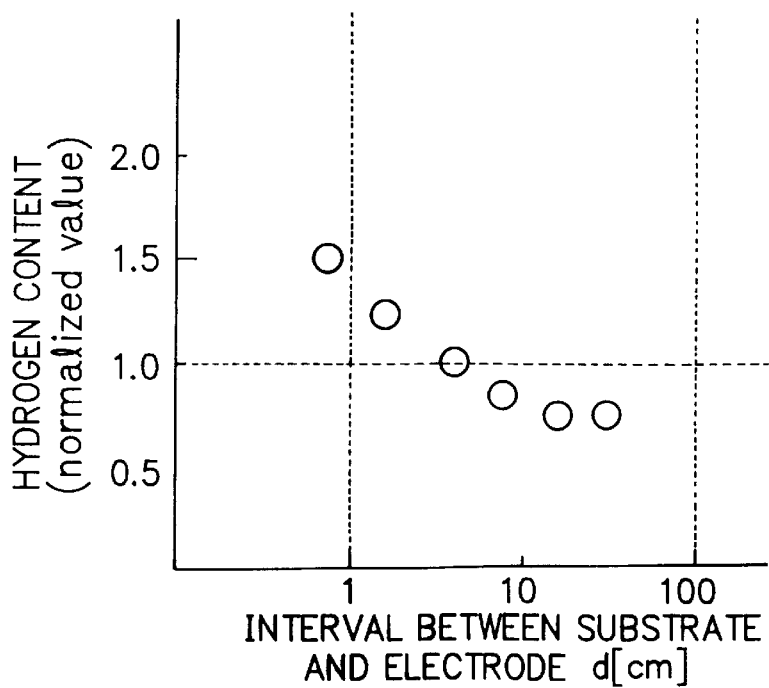
FIG. 9 is a graph showing an example of a relationship between hydrogen content and an interval between a substrate and an electrode.

The present invention attains the foregoing objects.

The present invention provides a process and apparatus which permit forming a μc-Si series thin film having a desired property which is capable of producing a high quality semiconductor device, at an improved film-forming raw material gas utilization efficiency and at a reasonable production cost.

As above described, a typical embodiment of the process is a process for forming a μc-Si series thin film by arranging a long substrate in a vacuum chamber so as to oppose an electrode provided in said vacuum chamber and while transporting said long substrate in the longitudinal direction, causing glow discharge between said electrode and the substrate to deposit said μc-Si series thin film on the substrate. A plurality of bar-like shaped electrodes as said electrode are arranged such that they are perpendicular to a normal line of said long substrate and their intervals to said long substrate are all or partially differed. The glow discharge is caused by using a high frequency power with an oscillation frequency in a range of from 50 MHz to 550 MHz, to deposit said μc-Si series thin film on the substrate.

A typical embodiment of the apparatus of the present invention is an apparatus for forming a μc-Si series thin film on a long substrate, having a portion in which said long substrate is arranged to oppose to an electrode in a vacuum chamber. While transporting said long substrate in the longitudinal direction, glow discharge occurs between the electrode and the substrate to deposit said μc-Si series thin film on the substrate. The apparatus has a plurality of bar-like shaped electrodes as said- electrode which are arranged such that they are perpendicular to a normal line of said long substrate and their intervals to said long substrate are all or partially differed. A high frequency power source is used to cause said glow discharge using a high frequency power with an oscillation frequency in -a range of from 50 MHz to 550 MHz.

The above-described process according to the present invention includes the following embodiments with respect to the arrangement of the bar-like shaped electrodes.

(i) The bar-like shaped electrodes are arranged such that they are parallel to each other.

(ii) The bar-like shaped electrodes are arranged such that they are perpendicular to the transportation direction of the long substrate.

(iii) The bar-like shaped electrodes are arranged such that their intervals to the long substrate are widened in the upper side of the transportation direction of the long substrate and narrowed in the down side thereof.

(iv) The bar-like shaped electrodes are arranged such that their intervals to the long substrate are periodically changed to the transportation direction of the long substrate.

In the following, description will be made of the constitution and action of the present invention.

In the present invention, due to using a frequency band in a range of from 50 MHz to 550 MHz which is between RF (radio frequency) and MW (microwave), it is possible to form a high quality μc-Si series thin film at an increased deposition rate, specifically, of more than 10 Å/sec.

Particularly, the frequency in this frequency band is higher than RF, and because of this, the self bias of plasma is decreased to diminish ion damage to a film deposited on a substrate. Further, in comparison with the MW plasma CVD process, the introduction of power is easier and the controllable range is widened, thus it is possible to form a high quality thin film. In addition, experimental studies by the present inventors, revealed that when film deposition on a long substrate is conducted using a high frequency power of said frequency band, in the case of a low power-density (that is, in a region where the deposition rate is increased in proportion to a power), the property of a film deposited differs depending on a difference in the interval between the electrode (the counter electrode) and the long substrate.

In the case of the above frequency band, in comparison, with RF, the maintenance of discharge under low pressure is easier, the electron temperature is lower, and the electron density is higher, and because of this, it is advantageous for the generation of long life radicals ($SiH_3^*$, $H^*$). At the same electron density, in the case of RF, the vapor phase reaction proceeds to produce polysilane. However, in the case of the above referenced band, even under conditions of producing polysilane when using RF, a desirable deposited film can be formed without producing such polysilane. In addition, from observing the discharge, a positive column which is observed in the plasma in the case of RF is not seen, however emission is observed in the vicinity of the cathode. In this connection, it is considered such that dissociation proceeds in the vicinity of the cathode. Radicals generated in the vicinity of the cathode are considered isotropically diffused, and during the diffusion, in a process of colliding with the parent molecules ($SiH_4$, $H_2$), the ion species and the short life radicals contained therein disappear. Depending on a difference in the interval between the substrate and the electrode, the density and component of the radicals reaching the substrate are changed, and this situation results in a difference in the property of a film deposited.

Especially, in the case a microcrystalline silicon ($\mu$c-Si); $H^*$ plays an important role for relaxation and rearrangement of the lattice, and a microcrystal is grown by way of combination of this radial with a stable site by $SiH_3^*$ which is likely to be surface-diffused. Hence, the ratio of these radicals and the like are important factors.

Therefore, in the case of the above-described frequency band, the magnitude of a power applied, the pressure, and the interval between the substrate and the electrode are important parameters in order to control the property of a film deposited. By properly controlling these parameters, the grain size, crystal deposition rate, hydrogen content, stress, absorption coefficient and the like can be changed. Further, for a compound such as SiGe:H or SiC:H, it is possible for the composition ratio thereof to be controlled based on difference in the decomposition energy or the lifetime of a radical.

Further in the case of the above-described frequency band, the wavelength is shortened to be equal to the electrode length. When the electrode comprises a flat electrode, a standing wave is present in the in-plane, where a node in which the power is weak and an antinode in which the power is strong. The positions of these node and antinode are different depending on the form of the electrode, the power introduction position the state of plasma generated, or the like, and because of this, it is difficult for them to be controlled as desired in the case of the flat electrode.

Occurrence of this problem can be prevented by making the flat electrode to comprise a plurality of bar-like shaped electrodes.

Based on the above-described factors, in the roll-to-roll film-forming system, by providing a plurality of bar-like shaped electrodes and properly adjusting their intervals to a long substrate which is continuously transported, the property of a microcrystal grown on said substrate in the thickness direction can be desirably controlled.

In the present invention, by arranging the bar-like shaped electrodes in parallel to each other, the way of the power introduced by each electrode in a width direction to the transportation direction of the long substrate is equalized and as a result, occurrence of film unevenness is further diminished. Further, by arranging the bar-like shaped electrodes to be perpendicular to the transportation direction of the long substrate, the film deposition position by each electrode is equalized to the transportation distance of the long substrate. As a result, occurrence of film unevenness due to the form of the vacuum chamber used or the passage of gas is further diminished.

As above described, the interval between the substrate and the electrode influences the property of the film deposited. In view of a semiconductor device to be produced, a $\mu$c-Si series thin film is deposited on an amorphous substrate comprising glass or the like or on a polycrystalline substrate comprising TCO (transparent electrically conductive oxide) or the like. In this case, there are such occasions that in the vicinity of the interface between the substrate and the $\mu$c-Si series thin film, an amorphous material of several tens to several hundreds nm is present or a layer of a small grain size is present. In many cases, being different from an amorphous silicon of a device grade, such layer is inferior in quality. Particularly, in the case of a semiconductor device such as a solar cell in which an electron is longitudinally mobilized, such layer is liable to deteriorate its electric characteristics. Therefore, it is desired to make sure that no such layer is present or when it should be present, its thickness is diminished.

Now, when a microcrystal having a large grain size and good quality to be deposited from an initial deposition stage, the following are important factors.

(1) Generation of a homogeneous crystalline nucleus of low density.

(2) Increase in crystal grain size.

(3) High speed growth in the film thickness direction.

For factor (1), when a highly dense crystalline nucleus is generated, though it is considered that coalescing of grains would occur, the grain size is substantially limited to an area occupied by one crystalline nucleus. Therefore, in the crystalline nucleus generation process, it, desired to employ conditions capable of generating a crystalline nucleus of low density without causing deposition of an amorphous layer.

For factor (2); ideally, it is desired to employ such conditions that the crystalline nucleus is grown crosswise without causing a new crystalline nucleus. This way a large grain size from the initial deposition stage can be obtained.

For the factor (3), in the case of using a microcrystal in a semiconductor device, a thickness of about 1 $\mu$m is necessitated. In order to shorten the time required in the preparation of the semiconductor device, a high speed deposition rate is necessitated. On a layer comprising a crystal of a $\mu$c-Si series thin film, crystallinity of good quality can be maintained by taking over the crystallinity of the under layer even when the deposition rate is increased to a certain extent.

Therefore, to grade the intervals of the bar-like shaped electrodes to the long substrate such that they are wide in the upper side of the transportation direction of the long substrate which is corresponding to the initial deposition stage and narrow in the down side is preferred in a viewpoint that the above process can be realized.

Besides, in the case of a semiconductor device such as a solar cell into which light is impinged from above, when it is constituted such that short wavelength light is absorbed in a region near the light incident side and long wavelength light is absorbed in a region remote from the light incident side, the semiconductor device can effectively absorb light. Therefore, the absorption coefficient is preferred to be such that it is decreased as the deposition proceeds. In this connection, by grading the intervals of the bar-like shaped electrodes to the long substrate such that they are wide in the upper side of the transportation direction of the long substrate which is corresponding to the initial deposition stage and narrow in the down side, the preparation of a semiconductor device having such constitution as above described can be realized.

Further, as above described, the property of a film deposited can be changed by changing the intervals of the electrodes to the substrate. Therefore, by arranging the bar-line shaped electrodes such that their intervals to the long substrate are periodically changed to the transportation direction of the long substrate, the property of a film deposited can be periodically changed. By this, the absorption coefficient is periodically changed. In the case of forming a solar cell using such deposited film whose absorption coefficient is periodically changed, there can be together attained large Voc and Jsc which are greater than those in the case of using a deposited film having a simple absorption coefficient. In addition, the stress of the film is changed so that the film is hardly peeled due a difference between the stress of the substrate and that of the film. Further, the resultant becomes desirably endurable upon curving or bending processing.

In the present invention, a film whose property is periodically changed and which has such advantages as above described can be readily realized in one deposited film.

By using the previously described apparatus, such processes above described can readily conducted.

In the following, the process for forming a $\mu$c-Si series thin film according to the present invention will be detailed.

$\mu$c-Si Series Thin Film:

Description will be made of a $\mu$c-Si series thin film according to the present invention which can be desirably used in a photovoltaic element.

As the constituent of the $\mu$c-Si series thin film, there can be mentioned materials containing Si element as a matrix. Specific examples of such material are group IV alloys such as SiGe, SiC, SiSn and the like.

As the $\mu$c-Si series thin film, there can be used appropriate microcrystalline semiconductor materials such as group IV microcrystalline semiconductor materials and group IV alloy series microcrystalline semiconductor materials. Preferable specific examples are: $\mu$c-Si:H (hydrogenated microcrystalline silicon), $\mu$c-Si:F, $\mu$c-Si:H:F, $\mu$c-SiGe:H, $\mu$c-SiGe:F, $\mu$c-SiGe:H:F, $\mu$c-SiC:H, $\mu$c-SiC:F, and $\mu$c-SiC:H:F.

Incidentally, for a semiconductor layer, valence electron control or forbidden band width control can be conducted. The control of these items can be conducted by separately introducing a raw material compound containing an element capable of being a valence electron controlling agent into a film-forming space upon forming a semiconductor layer or by mixing said raw material compound with a film-forming raw material gas or a dilution gas, followed by introduction into the film-forming space.

In the present invention, in the case where a $\mu$c-Si series thin film according to the present invention is subjected to valence electron control by means a valence electron controlling agent, at least part thereof is doped to be p-type and n-type, whereby forming at least a pin conjunction. And by stacking a plurality of pin junctions, there can be formed a stacked cell structure.

In the case of using a $\mu$c-Si series thin film according to the present invention as a power generation layer (a semiconductor photoactive layer) of a photovoltaic element, the average grain size is preferred to be in a range of from 10 nm to 1 $\mu$m, the crystal deposition rate is preferred to be in a range of from 10% to 99%, and the hydrogen content is preferred to be in a range of from 0.1 atomic % to 40 atomic %.

Formation of $\mu$c-Si Series Thin Film:

In the process of forming a $\mu$c-Si series thin film according to the present invention, by means of a high frequency power with an oscillation frequency in a range of from 50 MHz to 550 MHz, plasma is generated to dissociate and decompose a raw material gas, to cause film deposition on a substrate.

Specifically, starting gases such as a film-forming raw material gas, dilution gas and the like are introduced into a deposition chamber (a vacuum reaction chamber) whose inside can be maintained under reduced pressure. The inner pressure of the deposition chamber is made to be constant while evacuating the inside of the deposition chamber by means of a vacuum pump. A high frequency power with a desired oscillation frequency in the foregoing range from a high frequency power source is supplied to bar-like shaped electrodes arranged in the deposition chamber through a cable and a waveguide to generate plasma of said gases and decompose said gases, whereby forming a desired $\mu$c-Si series thin film on a substrate. According to the process of the present invention, it is possible to form a desirable $\mu$c-Si series thin film usable in a photovoltaic element under a wide range of deposition conditions.

The substrate temperature in the deposition chamber upon the film formation is preferred to be in a range of from 100 to 500° C. Similarly, the inner pressure is preferred to be in a range of from $1.3\times10^{-1}$ to $1.3\times10^2$ Pa. For the wattage of the high frequency power, it is preferred to be in a range of from 0.05 to 50 W/cm$^2$.

For the bar-like shaped electrodes used in the process of forming a $\mu$c-Si series thin film, each of them has a length is longer than a diameter or a longest side of the cross section. Each of the bar-like shaped electrodes may be of a cross section in a round form an ellipsoidal form, a square form or a rectangular form. Each of the bar-like shaped electrodes is constituted by a material which is not melted with heat and which does not cause reactions. Specific examples of such material are stainless steel and the like.

All the bar-like shaped electrodes are not necessary to be uniform with respect to their forms, but their forms may be varied. For the number of the bar-like shaped electrodes, it is properly determined depending on the size of a vacuum chamber (a deposition chamber) used, the deposition rate and the property for a $\mu$c-Si series thin film to be formed.

As described in Experiments 2 and 3 which will be described later, by adjusting the interval between the substrate and the electrode, the property of a $\mu$c-Si series thin film to be formed can be changed. Therefore, the bar-like shaped electrodes are desired to be arranged such that their intervals to the substrate (the long substrate) are all or partially varied, so that a desirable $\mu$c-Si series thin film can be formed. In a more preferred embodiment in this case, the intervals of the bar-like shaped electrodes to the long substrate are graded such that they are wide in the upper side of the transportation direction of the long substrate which is corresponding to the initial deposition stage and narrow in the down side. In order to form a desirable $\mu$c-Si series thin film having different properties it is preferred to arrange the bar-like shaped electrodes such that their intervals to the substrate (the long substrate) are partially periodically changed. [The intervals of the bar-like shaped electrodes to the substrate (the long substrate) will be hereinafter simply referred to as "interval between the substrate and the electrode"]

The interval between the substrate and the electrode is different depending on related film-forming conditions for forming a desired $\mu$c-Si series thin film. However, in view of a deposition rate which can be industrially employed in practice and also in terms of stability in the glow discharge, it is preferred to be in a range of from about 0.5 cm to about 30 cm.

The supply of a high frequency power to each of the bar-like shaped electrodes may be conducted by a manner of divergently supplying a high frequency power to each of the bar-like shaped electrodes from a single high frequency power source. Alternatively, it may be conducted by using a plurality of high frequency power sources. In this case, these high frequency power sources are desired to be complete with respect to their stability and conformity of oscillation frequency. If necessary, it is possible to conform their oscillation frequency by using a phase shifter or the like.

As the film-forming raw material gas suitable for forming a $\mu$c-Si series thin film of the present invention, there can be representatively mentioned silicon (Si)-containing compounds which are in the gaseous state at room temperature or can be easily gasified, germanium(Ge)-containing compounds which are in the gaseous state at room temperature or can be easily gasified, carbon(C)-containing compounds which are in the gaseous state at room temperature or can be easily gasified, and mixtures of these compounds.

Such Si-containing compound can include chain or cyclic silane compounds. Specific examples are $SiH_4$, $Si_2H_6$, $SiF_4$, $SiFH_3$, $SiF_2H_2$, $SiF_3H$, $Si_3H_8$, $SiD_4$, $SiHD_3$, $SiHD_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $(SiCl_2)_5$, $SiBr_4$, $(SiBr_2)_5$, $Si_2Cl_6$, $SiHCl_3$, $SiH_4Br_2$, $SiH_2Cl_2$, and $Si_2Cl_3F_3$.

Specific examples of such Ge-containing compound are $GeH_4$, $GeD_4$, $GeF_4$, $GeFH_3$, $GeF_2H_2$, $GeF_3H$, $GeHD_3$, $GeH_2D_2$, $GeH_3D$, $Ge_3H_6$, and $Ge_2D_6$.

Specific examples of such C-containing compound are $CH_4$, $CD_4$, $C_nH_{2n-2}$ (with n being an integer), $C_nH_{2n}$ (with n being an integer), $C_2H_2$, $C_6H_6$, $CO_2$, and CO.

Other than the above-mentioned raw materials, it is possible to use nitrogen (N)-containing raw material gas and oxygen (O)-containing raw material gas. Specific examples of such N-containing raw material gas are $N_2$, $N_3$, $ND_3$, NO, $NO_2$, and $N_2O$. Specific examples of such O-containing raw material gas are $O_2$, CO, $CO_2$, NO, $N_2O$, $CH_3CH_2OH$, and $CH_3OH$.

As above described, a $\mu$c-Si series thin film of the present invention may be controlled so as to have a conductivity of p-type or n-type by incorporating an appropriate valence electron controlling element (that is, a dopant) thereinto. Such element can include elements belonging to group IIIb of the periodic table which provide a p-type conductivity (these elements will be hereinafter referred to as group IIIb element) and elements belonging group Vb of the periodic table which provide an n-type conductivity (these elements will be hereinafter referred to as group Vb elements).

In order for the $\mu$c-Si series thin film to contain such dopants, an appropriate raw material capable of supplying a group IIIb or Vb element is used in addition to the foregoing film-forming raw material.

Such group IIIb or Vb element-supplying raw material can include raw materials capable of supplying group III b or Vb elements, which are in the gaseous state at room temperature or can be easily gasified at least under the condition for the formation of the $\mu$c-Si series thin film.

Such group IIIb element-supplying gaseous or gasifiable raw material can include boron hydrides such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$ and $BBr_3$. Besides, $AlCl_3$, $GaCl_3$, $Ga(CH_3)_3$, $InCl_3$, and $TlCl_3$ are also usable. Of these, $B_2H_6$ and $BF_3$ are particularly preferable.

Such group Vb element-supplying gaseous or gasifiable raw material can include phosphorous hydrides such as $PH_3$ and $P_2H_4$; and phosphorous halides such as $PH_4I$, $PF_3$, $PF_5$, $PCl_3$, $PCl_5$, $PBr_3$, $PBr_5$ and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable. Of these, $PH_3$ and $PF_3$ are particularly preferable.

Any of these group IIIb or Vb element-supplying raw materials may be diluted with an appropriate gas such as $H_2$ gas or inert gas such as Ar, He, Ne, Xe or Kr, if necessary.

In the following, description will be made of experiments which were conducted by the present inventors during the process to accomplish the present invention.

EXPERIMENT 1

First, description will be made of a film-forming apparatus of the roll-to-roll system used in this experiment.

Specifically, there was used a film-forming apparatus having such constitution as shown in FIG. 1. In FIG. 1, reference numeral 101 indicates a vacuum chamber (or a deposition chamber) which is provided with an exhaust pipe 107 connected to a vacuum pump (not shown) though a conductance valve 108 (comprising a butterfly valve). The exhaust pipe 107 is provided with a vacuum gauge 109. The inner pressure in the inside of the vacuum chamber 101 can be adjusted to a desired pressure by evacuating the inside of the vacuum chamber through the exhaust pipe by actuating the vacuum pump while properly regulating the conductance valve 108 and observing the vacuum gauge 109.

Reference numeral 102 indicates a web substrate (a long substrate) on which a film is to be deposited. The web substrate 102 is wound on a pay-out roll 111 provided in a load chamber 114 capable of being vacuumed. The web substrate 102 is paid out from the pay-out roll 111, and it passes through a gas gate 113a which is provided at a side wall (on the left side in the figure) of the vacuum chamber and enters into the vacuum chamber 101. Successively, the web substrate 102 passes through a gas gate 113b which is provided at a side wall (on the right side in the figure) of the vacuum chamber and enters into an unload chamber 115 capable of being vacuumed, where it is taken up by a take-up roll 112 provided in the unload chamber 115, followed by being wound on the take-up roll. Here, the pay-out roll side is an upper side and the take-up roll side is a down side in relation to the transportation direction of the web substrate.

Specifically, by rotating the pay-out roll 111 by means of a driving motor (not shown), from the pay-out roll 111, the web substrate 102 is continuously supplied, continuously moved in the vacuum chamber 101 in the longitudinal direction, and wound on the take-up roll 112. That is, the web substrate 102 is transported from the left side in the figure toward the right side in the figure.

Each of the gas gates 113a and 113b is structured so that the web substrate 102 can be transported without breaking the vacuum and a gate gas can be blown therein. The gas gate 113a serves to communicate between the load chamber 114 and the vacuum chamber 101 while maintaining each of the two chambers under reduced pressure. Similarly, the gas gate 113b serves to communicate between the vacuum chamber 101 and the unload chamber 115 while maintaining each of the two chambers under reduced pressure.

The gas gates 113a and 113b serve also as a communication means when the vacuum chamber 101 is connected to other vacuum chamber.

Reference numeral 110 indicates gas supply pipes which are open into the vacuum chamber 101. The gas supply pipes 110 are extended from a raw material gas supply system having a plurality of gas reservoirs each containing a given raw material gas (not shown in the figure) and they serve to introduce desired raw material gas into the vacuum chamber 101. The raw material gas introduced into the vacuum chamber 101 is exhausted through the exhaust pipe 107.

On rear side (which is not opposed to plasma 106) of the web substrate 102 in the vacuum chamber 101, there is provided a lamp heater unit 103 capable of radiating heat to heat the web substrate 102. Reference numeral 104 indicates a bar-like shaped electrode which is electrically connected to a high frequency power source 105 having a matching box installed therein through a cable or a waveguide (not shown)

The formation of a $\mu$c-Si series thin film using the film-forming apparatus shown in FIG. 1 is conducted in the following manner.

The web substrate 102 from the pay-out roll 111 is passed through the vacuum chamber 101 and fixed to the take-up roll 112. The inside of the vacuum chamber 101 is evacuated to a desired vacuum through the exhaust pipe 107 by actuating the vacuum pump (not shown). Through the gas supply pipes 110, prescribed raw material gas and dilution gas are introduced into the vacuum chamber 101. The lamp heater unit 103 is actuated, and the take-up roll 112 is rotated by means of a driving motor (not shown) to continuously move the web substrate 102. By this, the web substrate 102 is continuousy transported while passing through the vacuum chamber 101, where the web substrate 102 situated in the vacuum chamber 101 is heated by the lamp heater unit 103. Then, the high frequency power source 105 is switched on to supply a high frequency power with a desired oscillation frequency to the bar-like shaped electrode, where glow discharge is generated to produce plasma 106, whereby the raw material gas is decomposed by the action of the plasma to deposit a deposited film (a $\mu$c-Si series thin film) on the web substrate which is continuously moving.

Description will be made of experiments conducted by the present inventors.

Using the film-forming apparatus shown in FIG. 1, a $\mu$c-Si series thin film was formed on a web substrate 102 which is continuously moving, in accordance with the above-described manner.

As the web substrate 102, there was used a stainless steel SUS430BA web 0.2 mm thick, 20 cm in width and 50 m in length. As the vacuum pump of the vacuum pump, there were used a rotary pump, a mechanical booster pump and a turbo-molecular pump.

Specifically, the inside of each of the load chamber 114 containing the pay-out roll 111, the unload chamber 115 containing the take-up roll 112, and the vacuum chamber 101 was roughly evacuated by means of the rotary pump. Successively, the inside of each of the load chamber 114 containing the pay-out roll 111, the unload chamber 115 containing the take-up roll 112, and the vacuum chamber 101 was evacuated by means of the mechanical booster pump until the pressure became about $1.3 \times 10^{-1}$ Pa. While maintaining the surface of the web substrate at 300° C. by means of the lamp heater unit 103, the inside of the vacuum chamber 101 is evacuated to a vacuum of about $2.7 \times 10^{-3}$ Pa by means of the turbo-molecular pump. When the inner-pressure of the vacuum chamber 101 became stable a about $2.7 \times 10^{-3}$ Pa, $H_2$ gas of 400 sccm as a purging gas from the gas supply system (not shown) was introduced into the vacuum chamber through a mass flow controller (not shown) and the gas supply pipes 110 and a conduit (not shown) connected to the vacuum chamber 101. Successively, the inside of the vacuum chamber 101 was evacuated by means of the turbo-molecular pump for 2 hours while regulating the butterfly valve 108 provided at the exhaust pipe 107 so that the reading on the vacuum gauge 109 became $6.7 \times 10^{-1}$.

Thereafter, $SiH_4$ gas and $H_2$ gas from the gas supply system (not shown) were introduced into the vacuum chamber 101 through mass flow controllers (not shown) and the gas supply pipes 110 under conditions described below, where the butterfly valve 108 was regulated so that the reading on the vacuum gauge 109 became to be in a range $1.3 \times 10^{-1}$ to $1.3 \times 10^2$ Pa. Particularly, the above gases were first flowed for 30 minutes. Then, while the gases continued flowing, from the high frequency power source 105, a high frequency power with an oscillation frequency in a range of 13.56 MHz to 1000 MHz in terms of an effective value was supplied to the bar-like shaped electrode 104 to produce plasma 106, whereby a deposited film was formed on the web substrate 102 over its length of 40 m. In this case, the web substrate 102 was transported at a transportation speed of 14 cm/minute.

The film-forming conditions in this case are as follows.
Film-Forming Conditions:
  raw material gas ($SiH_4$): 50 sccm
  dilution gas ($H_2$): 2000scam
  oscillation frequency: 13.56 to 1000 MHz
  high frequency power: 0.05 to 50 W/cm$^2$
  inner pressure in the deposition chamber: $1.3 \times 10^{-1}$ to $1.3 \times 10^2$ Pa
  interval between substrate and electrode: 0.5 to 30 cm
    substrate temperature: 300° C.
  deposited film thickness: 7 $\mu$m
  deposition rate: 10 Å/sec.
  electrode form: 5 cm (diameter)×25 cm (length)

After the formation of the deposited film, the web substrate 102 was cooled to room temperature and taken out from the film-forming apparatus.

In this way, there were obtained a plurality of samples each comprising the web substrate 102 having the deposited film formed thereon (each sample will be hereinafter referred to as "web substrate sample").

For each web substrate sample, with respect to its width direction, a part thereof was cut to obtain an experimental sample. Thus, there were obtained a plurality of experimental samples.

For these experimental samples prepared by changing the oscillation frequency and adjusting the wattage of the high frequency power, the inner pressure in the vacuum chamber, and the interval between the substrate and the electrode so that the deposition rate was constant for the purpose of examining influences of the oscillation frequency, the following evaluations were conducted. The evaluated results with respect to distribution of the film property in the width direction of the web substrate 102 are graphically shown in FIGS. 2 to 5.

Evaluation Contents:

1. Visual Examination and Examination by an Optical Microscope.

2. Evaluation of Absorption Coefficient:

Wavelength dependency of the absorption coefficient of a μc-Si series thin film was examined by measuring its transmittance using a spectrophotometer U4000 type (produced by Hitachi Ltd.).

3. Evaluation of Average Grain Size:

This evaluation was conducted in a manner wherein a cross section of the crystal is observed by means of a transmission electron microscope (TEM) JEM-4000EX (produced by JEOL Ltd.), respective crystal grain boundaries are determined by way of image processing, and based on the resultant images, an average grain size in the vicinity of the surface and in a direction parallel to the substrate is obtained.

4. Evaluation of Crystal Volume Fraction:

This evaluation was conducted in a manner wherein a Raman scattering spectrum is measured by means of a laser. Raman spectrophotometer NRS200C (produced by Nihon Bunko Kabushiki Kaisha), followed by obtaining an intensity ratio between a strong signal from a crystal near 520 $cm^{-1}$ and a broad signal from an amorphous material near 480 $cm^{-1}$, whereby obtaining a crystal volume fraction.

5. Evaluation of Hydrogen Content:

This evaluation was conducted in a manner wherein an infrared absorption spectrum is measured by means of a FTIR method and based-on the absorption near 2000 $cm^{-1}$, a hydrogen content is obtained As a result, in the case of the oscillation frequency being less than 50 MHz, even when film deposition was conducted at a desired deposition rate by properly changing the wattage of the high frequency power, the interval between the substrate and the electrode, and the inner pressure in the vacuum chamber, there was deposited an amorphous silicon film only. As a result of observing its surface by way of visual examination and examination by means of an optical microscope, it was found that the surface is white-clouded and is in a roughened state. In addition, there was observed the presence of polysilane in the inside of the vacuum chamber. In this respect, it is considered that such polysilane is incorporated into the film and as a result, such film resulted.

In the case of the oscillation frequency being beyond 550 MHz, sudden disappearance of the glow discharge was observed. And even when film deposition was conducted at a desired deposition rate by properly changing the wattage of the high frequency power, the interval between the substrate and the electrode, and the inner pressure in the vacuum chamber, there was observed unevenness (of more than 10%) for the film property in the width direction. In addition, the situation of causing such unevenness was different with respect to the longitudinal direction of the substrate. Hence, it was found that in the case of forming a μc-Si series thin film on a long substrate, it is difficult to maintain a desired film property.

EXPERIMENT 2

Using the same apparatus used in Experiment 1 and following the procedures in Experiment 1, how the properties of the resulting μc-Si series thin films are changed by changing the interval between the substrate and the electrode was examined. The film-forming conditions were made as follows.

Film-Forming Conditions:

raw material gas ($SiH_4$): 50 sccm dilution gas ($H_2$): 2000 sccm oscillation frequency: 200 MHz high frequency power: 10 $W/cm^2$ inner pressure in the deposition chamber: $2.7 \times 10^1$ Pa interval between substrate and electrode: 0.5 to 30 cm substrate temperature: 300° C.

deposited film thickness: 7 μm electrode form: 5 cm (diameter)×25 cm (length)

And following the, evaluation procedures in Experiment 1, evaluation was conducted.

As a result, it was found that when the interval between the substrate and the electrode is 0.5 cm, there is formed a deposited film apparently of amorphous silicon. And when the interval between the substrate and the electrode was beyond 30 cm, the film deposition rate became slow, and it was substantially difficult to deposit a desired thickness.

The results obtained in this: -experiment are graphically shown, in FIGS. 6 to 9. As these figures illustrate, it was found that the property of the resulting μc-Si series thin film is varied by changing the interval between the substrate and the electrode.

EXPERIMENT 3

Using the same apparatus used in Experiment 1 and following the procedures in Experiment 1, how the properties of the resulting μc-Si series thin films are changed depending on a given condition at the initial film deposition stage by a manner of changing only the interval between the substrate and the electrode at the initial deposition stage and conducting successive film deposition under the same film-forming conditions. For this, purpose, there was formed a pin junction type photovoltaic element. Particularly, an n-type a-Si layer, an i-type μc-Si layer and a p-type μc-Si layer were sequentially formed on the web substrate. The formation of the n-type layer and the p-type layer was conducted using the apparatus shown in FIG. 1 except for changing the high frequency power source 105 to an RF power source. (13.56 MHz).

The respective conditions were made as will be described below.

The Conditions at the Initial Film Deposition Stage:

raw material gas ($SiH_4$) 50 sccm dilution gas ($H_2$): 2000 sccm oscillation frequency: 200 MHz high-frequency power: 50 $W/cm^2$ inner pressure in the deposition chamber: $2.7 \times 10^1$ Pa interval between substrate and electrode: 0.5 to 30 cm substrate temperature: 300° C.

deposited film thickness: 300 nm

The Same Conditions was Examined Thereafter:

raw material gas ($SiH_4$): 50 sccm dilution gas ($H_2$): 2000 sccm oscillation frequency: 200 MHz high frequency power: 50 $W/cm^2$ inner pressure in the deposition chamber: $2.7 \times 10^1$ Pa interval between substrate and electrode: 5 cm substrate temperature: 300° C.

deposited film thickness. 6.7 μm electrode form: 5 cm (diameter)×25 cm (length)

The Conditions for the Formation of the n-type Layer:
   SiH$_4$: 5 sccm
   H$_2$: 50 sccm
   PH$_3$/H$_2$ (5%): 0.1 sccm
   RF power: 0.1 W/cm$^2$
   inner pressure in the deposition chamber: 1.1×10$^2$ Pa
   substrate temperature: 300° C.
   deposited film thickness: 30 nm
The Conditions for the Formation of the p-type Layer:
   SiH$_4$: 5 sccm
   H$_2$: 200 sccm
   BF$_3$/H$_2$ (5%): 0.1 sccm
   RF power: 3 W/cm$^2$
   inner pressure in the deposition chamber: 2.0×10$^2$ Pa
   substrate temperature: 200° C.
   deposited film thickness: 20 nm For the photovoltaic element thus formed, its crystal cross section was observed by means of a transmission electron microscope (TEM) JEM-4000EX (produced by JEOL Ltd.), and the thickness of a portion considered to comprise an a-Si from an initially deposited portion was evaluated. The results obtained are graphically shown in FIG. 10. Further, for the photovoltaic element, evaluation of its initial photoelectric conversion efficiency and light degradation test were conducted. The results obtained are collectively shown in Table 1.

The evaluation of initial photoelectric conversion efficiency was conducted by placing a solar cell prepared using the photovoltaic element under the irradiation of pseudo sunlight of AM-1.5 (100 mW/cm$^2$) and measuring its V-I characteristics.

The light degradation test was conducted bye placing the solar cell having been subjected to the evaluation of the initial photoelectric conversion efficiency in an environment with a humidity of 50% and a temperature of 25° C. while irradiating pseudo sunlight of AM-1.5 thereto for 500 hours, measuring its photoelectric conversion efficiency under the irradiation of pseudo sunlight of AM-1.5 (100 mW/cm$^2$) in the same manner as above and calculating a deteriorated rate of the initial photoelectric conversion efficiency.

Based on the results shown in Table 1, there were obtained such findings as will be described in the following. That is, by changing the interval between the substrate and the electrode, it is possible to prevent the deposition of an amorphous layer at the initial film deposition stage and a layer whose constituent crystal grains being of small size. And the presence of these layers deteriorates the characteristics of a semiconductor device such as a photovoltaic element.

In the following, the present invention will be described in more detail with reference to examples. It should be understood that these examples are only for illustrative purposes and are not intended to restrict the scope of the present invention.

EXAMPLE 1

Figure 11:
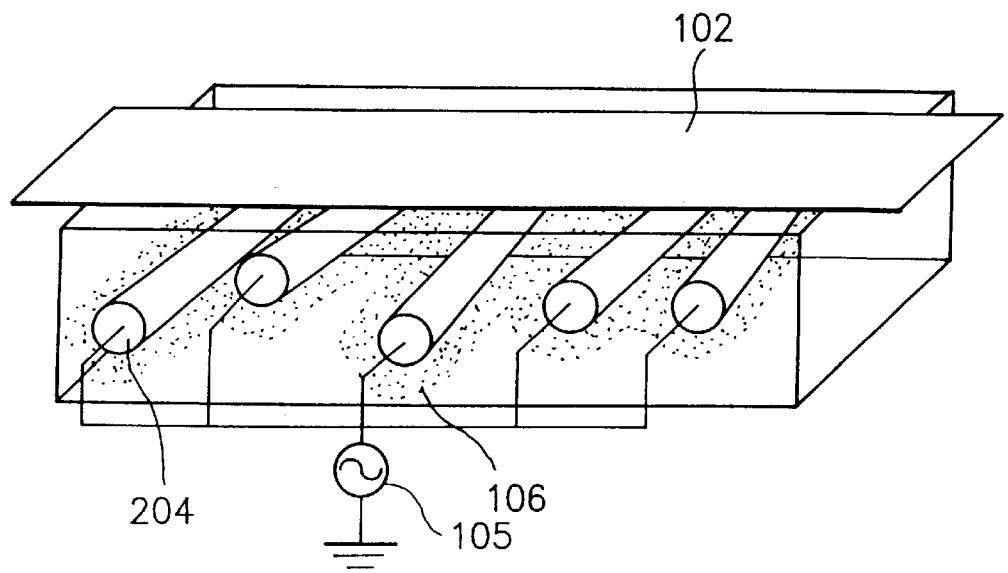

As the bar-like shaped electrode 104 in the film-forming apparatus shown in FIG. 1, as shown in FIG. 11 (which is a conceptual diagram which is not always in agreement with actual experimental conditions), a plurality of bar-like shaped electrodes 204 each being the same as the bar-like shaped electrode 104 used in Experiment 1 were arranged such that they are perpendicular to a normal line of a long substrate 102 and their intervals to the long substrate are differ from each other.

Using the apparatus thus constituted, a μc-Si series thin film was formed under such conditions as will be described below.

As the long substrate 102, there was used a stainless steel SUS430BA web of 0.2 mm in thickness, 20 cm in width and 50 m in length having a 1 μm thick zinc oxide (ZnO) film formed thereon. The formation of μc-Si series thin film was conduct ed in accordance with the procedures in Experiment 1, except for changing the film-forming conditions in Experiment 1 to those below mentioned.

Film-Forming Conditions:
   raw material gas (SiH$_4$): 50 sccm
   dilution gas (H$_2$): 2000 sccm
   oscillation frequency: 200 MHz
   high frequency power: 10 W/cm$^2$
   inner pressure in the deposition chamber: 2.7×10$^{-1}$ Pa
   intervals of the electrodes to the long substrate (from the upper side of the substrate transportation direction):
      3 cm interval: 10 bar-like shaped electrodes,
      5 cm interval: 10 bar-like shaped electrodes,
      10 cm interval: 10 bar-like shaped electrodes,
      5 cm interval: 10 bar-like shaped electrodes, and
      4 cm interval: 10 bar-like shaped electrodes
   interval between each adjacent electrodes (the distance from the center on the central axis of one bar-like shaped electrode to that of the other bar-like shaped electrode): 10 cm
   substrate temperature: 300° C.
   deposited film thickness: 10 μm

COMPARATIVE EXAMPLE 1-1

Figure 12:
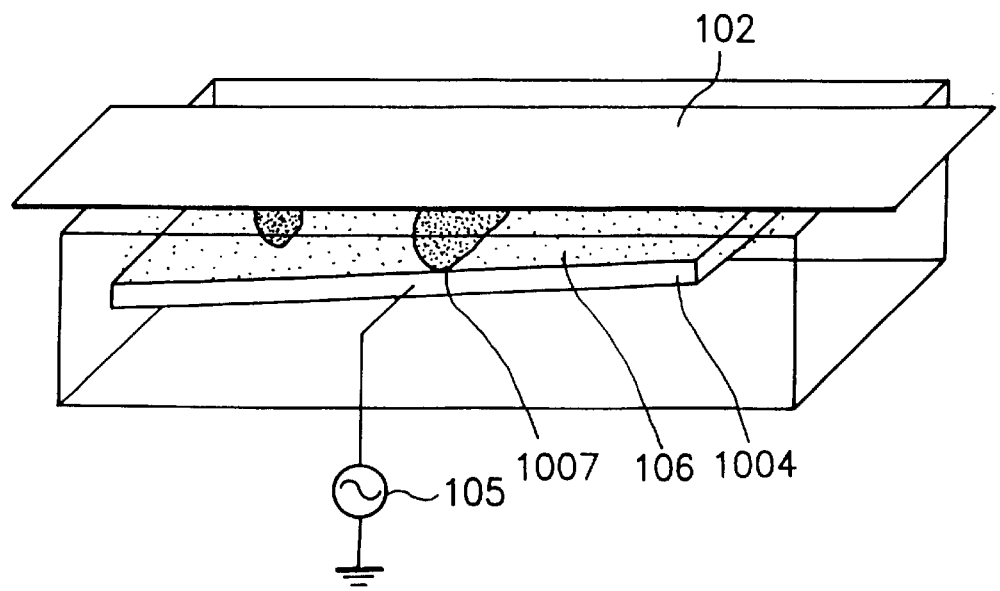

Using a flat plate type electrode 1004 as shown in FIG. 12 (which is a conceptual diagram which is not always in agreement with actual experimental conditions), the formation of μc-Si series thin film was conducted under film-forming conditions similar to those in Example 1.

The flat plate type electrode 1004 herein is of a length of 5 m. The interval between the substrate and the electrode was graded to be from 3 cm to 5 cm from the upper side of the substrate transportation direction. Here, reference numeral 1007 in FIG. 12 schematically shows a plasma high density region.

COMPARATIVE EXAMPLE 1-2

Using a plurality of bar-like shaped electrode 104 as shown in FIG. 13 (which is a conceptual diagram which is not always in agreement with actual experimental conditions), the formation of μc-Si series thin film was conducted under film-forming conditions similar to those in Example 1.

In this example, 50 bar-like shaped electrodes were spacedly arranged so as to have an equal interval of 3 cm to a long substrate 102. And the interval between each adjacent electrode (the distance in a horizontal direction from the center on the central axis of one bar-like shaped electrode to that of the other bar-like shaped electrode) was made to be 10 cm.

In each of Example 1 and Comparative Examples 1-1 and 1-2, plasma discharge was maintained for 10 hours, where the state of plasma produced was observed by way of visual examination. As a result, in each of Example 1 and Comparative Example 1-2, the state of the plasma was stable all the time. But in Comparative Example 1-1, such a localized plasma region that is schematically shown as a plasma high density region 1007 in FIG. 12 or a partially dense plasma region occurred. In addition, it was observed that the discharging position was suddenly changed during the plasma discharge.

As a result of having measured a film thickness distribution to the prescribed 10 μm, the film thickness distribution in each of Example 1 and Comparative Example 1-2 was found to fall within 15% for both the width direction and thee longitudinal direction of the substrate. On the other hand, in Comparative Example 1-1, it was found to be beyond 15%.

As a result of having evaluated a distribution with respect to each of absorption coefficient, crystal volume fraction, and hydrogen content, the distribution in each of Example 1 and Comparative Example 1-2 was found to fall within 15% with respect to the width direction and the longitudinal direction of the substrate. On the other hand, in Comparative Example 1-1, amorphous portions were present, and the distribution was found to be beyond 15%.

In each of Example 1 and Comparative Example 1-2, evaluation was conducted with respect to profile of each of absorption coefficient, crystal volume fraction, and hydrogen content in the depth direction in the following manner.

Evaluation of Absorption Coefficient:

In order to examine a variation in a band profile of absorption coefficient for a thin film sample, a variation in the absorption coefficient in the depth direction is evaluated in a manner of polishing a predetermined thickness of the thin film sample by means of CMP (chemical-mechanical polishing), and measuring the transmittance thereof by means of a spectrophotometer U4000 type (produced by Hitachi Ltd.). The absorption coefficient corresponds to an average value thereof when the absorption coefficient is considered to be distributed with the film. Therefore, it is possible to estimate a distribution of the absorption coefficient by observing how the absorption coefficient is changed along with a change in the film thickness.

Evaluation of Average Grain Size:

This evaluation is conducted in a manner wherein a crystal cross section of a thin film sample is observed by means of a transmission electron microscope (TEM) JEM-4000EX (produced-by JEOL Ltd.), respective crystal grain boundaries are determined by way of image processing, and based on the resultant images, a variation in an average grain size in the depth direction in a direction parallel to the substrate is examined.

Evaluation of Crystal Deposition Rate:

This evaluation is conducted as follows. That is, for a thin film sample (which is formed on the ZnO (of polycrystal) of the substrate), when the substrate is subjected to plastic deformation at an acute angle of more than 150°, there is afforded a cross section of the μc-Si layer together with a wall interface of the ZnO polycrystal. For said cross section, by using a laser Raman spectrophotometer NRS200C (produced by Nihon Bunko Kabushiki Kaisha) while throttling the spot of the laser beam, a Raman scattering spectrum is measured with a resolving power of 1 μm, followed by obtaining an intensity ratio between a strong signal from a crystal near 520 cm$^{-1}$ and a broad signal from an amorphous material near 480 cm$^{-1}$, and based on the intensity ratio, a variation in the crystal deposition rate in the depth direction is evaluated.

Evaluation of Hydrogen Content:

This evaluation is conducted by subjecting a thin film sample to hydrogen content analysis by way of SIMS (secondary ion mass: spectrometry), to obtain a hydrogen content profile in the depth direction.

In the following, description will be made of the evaluated results.

With Respect to the Absorption Coefficient:

The absorption coefficient in Comparative Example 1-2 was found to be simply decreased. Particularly, the absorption coefficient of a portion (which is about 200 nm thick) corresponding to the initial deposition stage is small, and for the absorption thereafter, it coincides well with a model in which a substantially constant absorption coefficient is assumed.

On the other hand, the absorption coefficient in Example 1 was found to be increased and decreased. Particularly, it was found that a layer having a large absorption coefficient and a layer having a small absorption coefficient are stacked in the thickness direction.

With Respect to the Average Grain Size:

The evaluated results of this evaluation item are shown Table 2.

In Comparative Example 1-2, there was obtained a finding that although an amorphous layer is present and the average grain size is gradually increased until near 200 nm from the substrate, the average grain size thereafter is substantially constant until near the surface.

In Example 1, there was obtained a finding that the state at the initial deposition stage in Example 1 is around the same as that in Comparative Example 1-2, but the average grain size thereafter is varied such that it is increased and decreased in the depth direction.

Figure 14A:
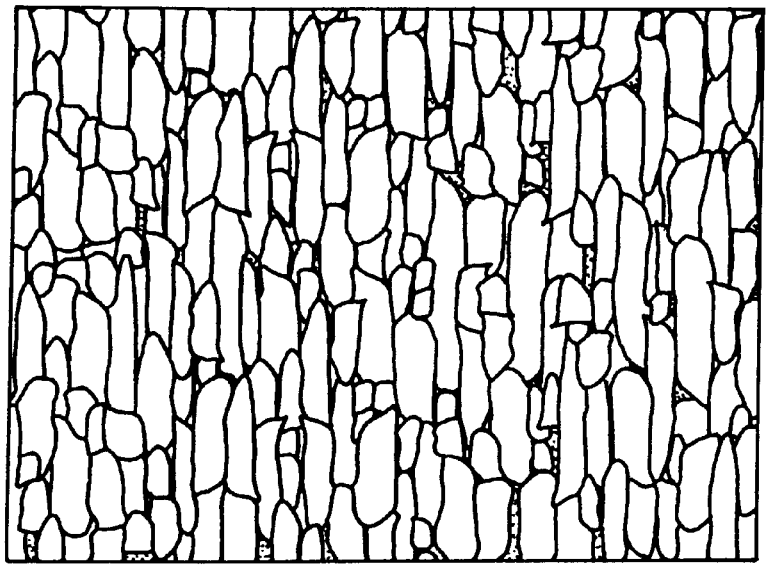
FIGS. 14(a) and 14(b) are schematic cross-sectional views respectively for explaining an example of a cross section of a μc-Si series thin film.
Figure 14B:
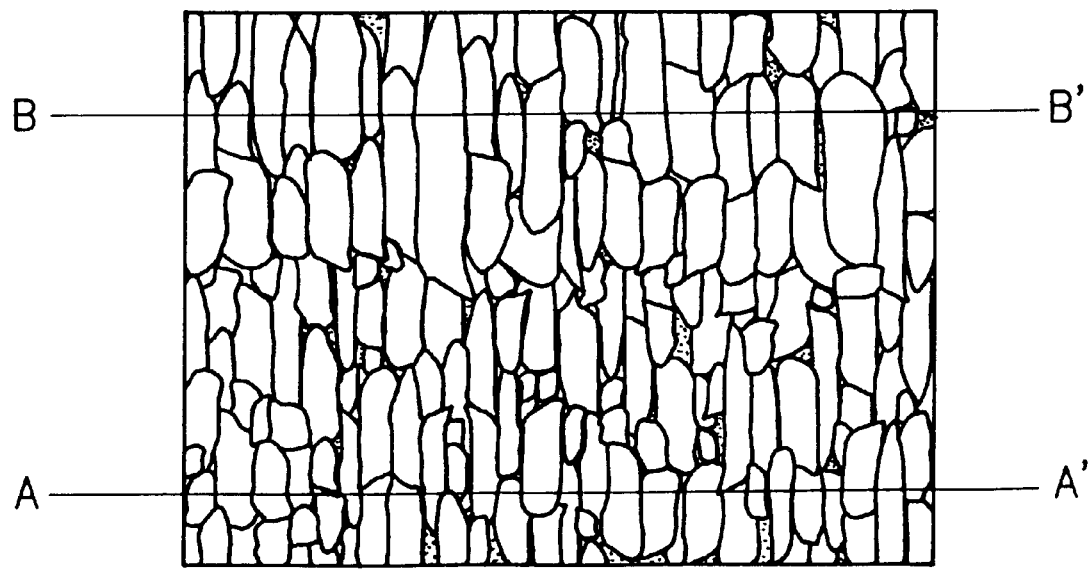

In FIG. 14(*a*), there is shown a part of the cross section by TEM in Comparative Example 1-2. In FIG. 14(*b*), there is shown a part-of the cross section by TEM in Example 1. It is understood that portion where substantially no grain size-changed portion is present in the cross section of Comparative Example 1-2 as shown in FIG. 14(*a*), but in the cross section of Example 1, as shown in FIG. 14(*b*), there are present grain size-changed portions A–A' and B–B'.

With Respect to the Crystal Volume Fraction:

The evaluated results of this evaluation item are shown in Table 3. Based on the results shown in Table 3, the crystal volume fraction in Comparative Example 1-2 was found to be substantially constant until near the surface. On the other hand, the crystal volume fraction in Example 1 was found to be varied such that it is first increased and then decreased.

Figure 15:
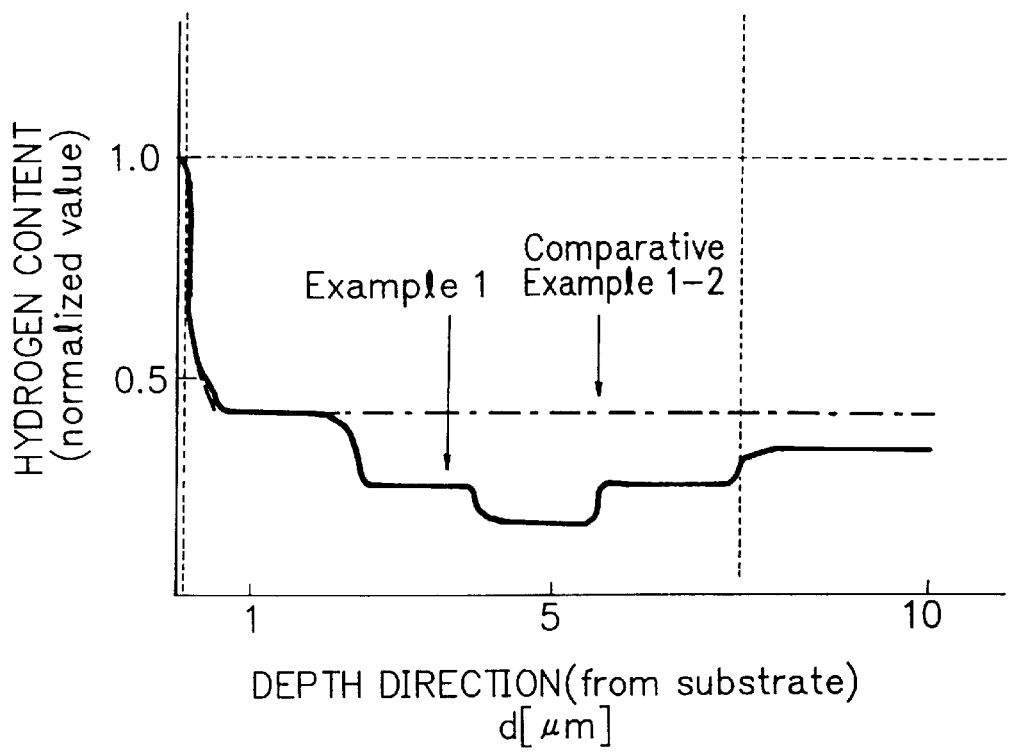
FIGS. 15, 19 and 21 are graphs respectively for explaining an example of hydrogen content in a depth (thickness) direction of a deposited film.

With Respect to the Hydrogen Content:

The evaluated results of this evaluation item are graphically shown in FIG. 15. Based on the results shown in FIG. 15, the following facts are understood. That is, in Comparative Example 1-2, a layer having a large hydrogen content is present until near 200 nm from the substrate, and although the hydrogen content thereafter is decreased, the successive hydrogen content is substantially constant until near the surface. On the other hand, in Example 1, although the state at the initial deposition stage is around the same as that in Comparative Example 1-2, the hydrogen content thereafter is varied such that it is increased and then decreased.

As will be understood from the above description, it is understood that according to the method of Example 1, it is possible to readily form a μc-Si series thin film whose properties are desirably controlled in the thickness direction.

EXAMPLE 2

Figure 16:
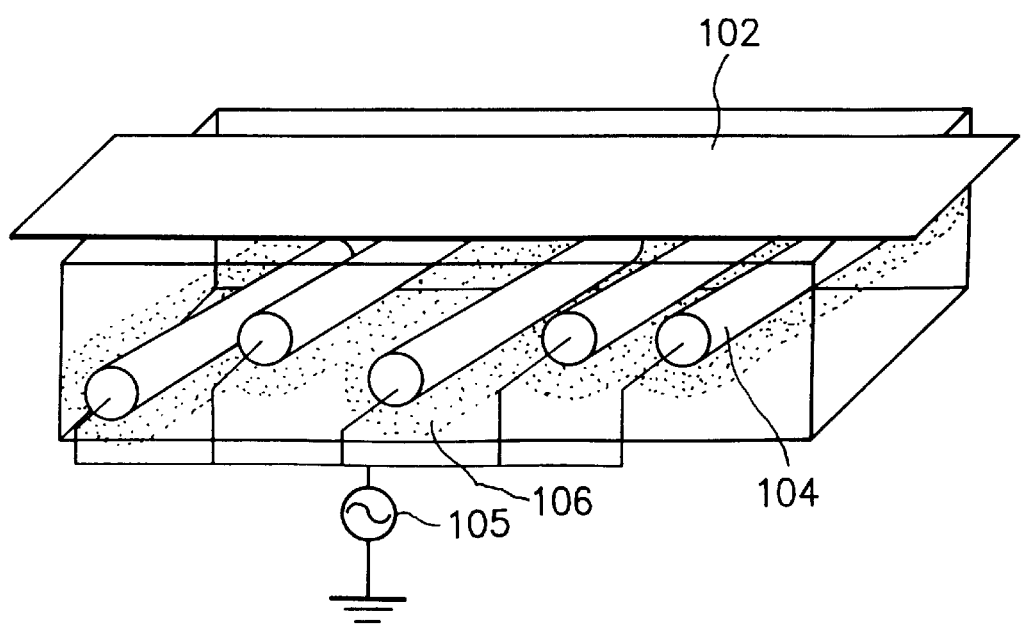

As the bar-like shaped electrode 104 in the film-forming apparatus shown in FIG. 1, as shown in FIG. 16 (which is a conceptual diagram which is not always in agreement with actual experimental conditions), a plurality of bar-like shaped electrodes 104 each being the same as the bar-like shaped electrode 104 used in Experiment 1, were arranged in parallel to each other such that they are perpendicular to a normal line of a long substrate 102 and their intervals to the long substrate are partially differed.

Using the apparatus thus constituted, a µc-Si series thin film was formed under such conditions as will be described below.

As the long substrate 102, there was used a stainless steel SUS430BA web of 0.2 mm in thickness, 20 cm in width and 50 m in length having a 1 µm thick zinc oxide (ZnO) film formed thereon. The formation of µc-Si series, thin film was conducted in accordance with the procedures in Experiment 1, except for changing the film-forming conditions in Experiment 1 to those below mentioned.

Film-Forming Conditions:
- raw material gas ($SiH_4$): 50 sccm
- dilution gas ($H_2$): 2000 sccm
- oscillation frequency: 200 MHz
- high frequency power: 10 W/cm$^2$
- inner pressure in the deposition chamber: $2.7 \times 10^{-1}$ Pa
- intervals of the electrodes to the long substrate (from the upper side of the substrate transportation direction):
  - 3 cm interval: 10 bar-like shaped electrodes,
  - 5 cm interval: 10 bar-like shaped electrodes,
  - 5 cm interval: 10 bar-like shaped-electrodes,
  - 5 cm interval: 10 bar-like shaped electrodes, and
  - 5 cm interval: 10 bar-like shaped electrodes
- interval between each adjacent electrodes (the distance in a horizontal direction from the center on the central axis of one bar-like shaped electrode to that of the other bar-like shaped electrode):
  - 10 cm
- substrate temperature: 300° C.
- deposited film thickness: 10 µm

EXAMPLE 3

The procedure of Example 2 were repeated, except that the arrangement of the bar-like shaped electrodes was changed to be not in parallel to each other, to form a µc-Si series thin film.

Evaluation

Evaluation with respect to film thickness distribution in the width direction of the substrate was conducted in the same manner as in Example 1. As a result, the film thickness distribution in Example 2 was found to fall within 10%, but that in Example 3 was found to be 13%.

As a result of having evaluated a distribution with respect to each of absorption coefficient, crystal deposition rate, and hydrogen content respectively in the width direction of the substrate, the distribution in Example 2 was found to fall within 10%, but that in Example 3 was found to be 13%.

Based on the above results, it is understood that by arranging the bar-like shaped electrodes in parallel to each other as in Example 2, it is possible to diminish unevenness in the film thickness in the width direction of the substrate.

EXAMPLE 4

Figure 17:
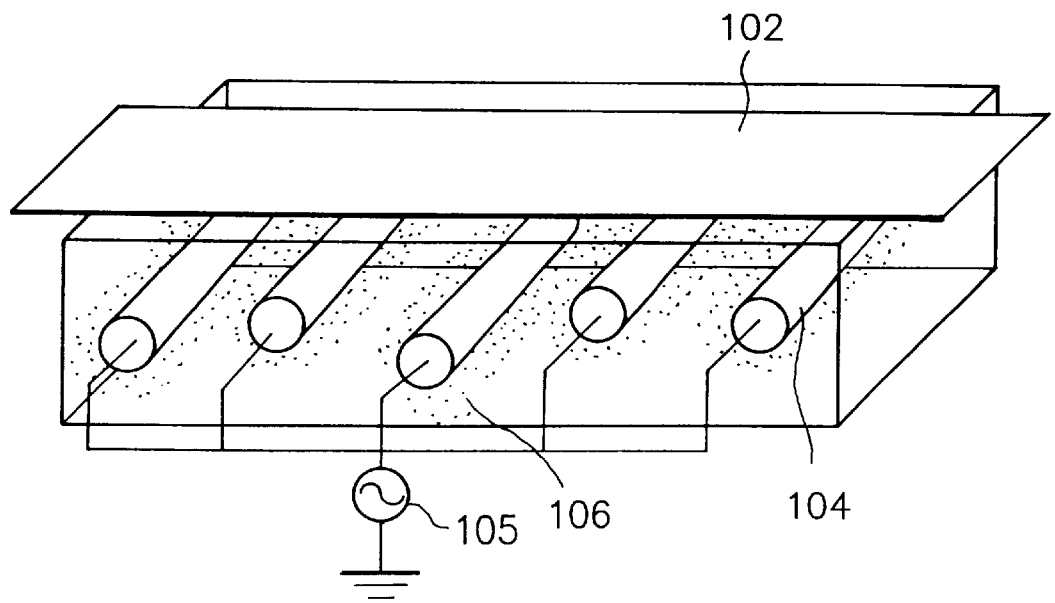

As the bar-like shaped electrode 104 in the film-forming apparatus shown in FIG. 1, as shown in FIG. 17 (which is a conceptual diagram which, is not always in agreement with actual experimental conditions), a plurality of bar-like shaped electrodes 104 each being the same as the bar-like shaped electrode 104 used in Experiment 1, were arranged in parallel to each other such that they are perpendicular to a normal line of a long substrate 102, they are perpendicular to the direction for the long substrate to be transported, and their intervals to the long substrate are partially differed.

Using the apparatus thus constituted, a µc-Si series thin film was formed under such conditions as will be described below.

As the long substrate 102, there was used a steel SUS430BA web of 0.2 mm in thickness, 20 cm in 50 m in length having a 1 µm thick zinc oxide (ZnO) film formed thereon. The formation of µc-Si series thin film was conducted in accordance with the procedures in Experiment 1, except for changing the film-forming conditions in Experiment 1 to those below mentioned.

Film-Forming Conditions:
- raw material gas ($SiH_4$): 50 sccm
- dilution gas ($H_2$): 2000 sccm
- oscillation frequency: 200 MHz
- high frequency power: 10 W/cm$^2$
- inner pressure in the deposition chamber: $2.7 \times 10^{-1}$ Pa
- intervals of the electrodes to the long substrate (from the upper side of the substrate transportation direction):
  - 3 cm interval: 10 bar-like shaped electrodes,
  - 5 cm interval: 10 bar-like shaped electrodes,
  - 5 cm interval: 10 bar-like shaped electrodes,
  - 5 cm interval: 10 bar-like shaped electrodes, and
  - 5 cm interval: 10 bar-like shaped electrodes
- angle of each electrode to the direction for the substrate to be transported: 90°
- interval between each adjacent electrodes (the distance in a horizontal direction from the center on the central axis of one bar-like shaped electrode to that of the other bar-like shaped electrode):
  - 10 cm
- substrate temperature: 300° C.
- deposited film thickness: 10 µm Evaluation Evaluation with respect to film thickness distribution in the width direction of the substrate was conducted in the same manner as in Example 1. As a result, the film thickness distribution in Example 4 was found to fall within 8%, which is superior to Example 2 in terms of uniformity.

And, as a result of having evaluated a distribution with respect to each of absorption coefficient, crystal deposition rate, and hydrogen content respectively in the width direction of the substrate, the distribution in Example 4 was found to fall within 8%, which is superior to Example 2 in terms of uniformity.

Based on the above results, it is understood that by arranging the bar-like shaped electrodes to be perpendicular to the transportation direction of the substrate as above described, it is possible to diminish unevenness in the film thickness in the width direction of the substrate.

EXAMPLE 5

Figure 18:
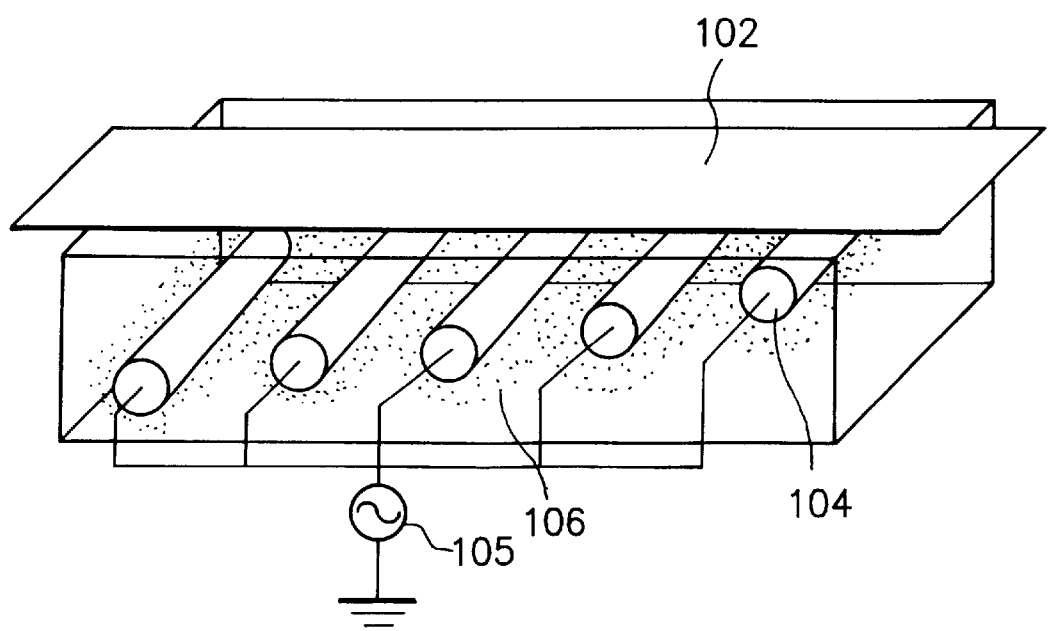

As the bar-like shaped electrode 104 in the film-forming apparatus shown in FIG. 1, as shown in FIG. 18 (which is a conceptual .diagram which is not always in agreement with actual experimental conditions), a plurality of bar-like shaped electrodes 104 each being the same as the bar-like shaped electrode 104 used in Experiment 1 were arranged such that they are perpendicular to a normal line of a long-substrate 102 and their intervals to the long substrate are widened in the upper side of the transportation direction of the long substrate and narrowed in the down side thereof.

Using the apparatus thus constituted, a μc-Si series thin film was formed under such conditions as will be described below.

As the long substrate 102, there was used a stainless steel SUS430BA web of 0.2 mm in thickness, 20 cm in width and 50 m in length having a 1 μm thick zinc oxide (ZnO) film formed thereon. The formation of μc-Si series thin film was conducted in accordance with the procedures in Experiment 1, except for changing the film-forming conditions in Experiment 1 to those below mentioned.

Film-Forming Conditions:
  raw material gas (SiH$_4$): 50 sccm
  dilution gas (H$_2$): 2000 sccm
  oscillation frequency: 200 MHz
  high frequency power: 10 W/cm$^2$
  inner pressure in the deposition chamber: 2.7×10$^{-1}$ Pa
  intervals of the electrodes to the long substrate (from the upper side of the substrate transportation direction):
    15 cm interval: 5 bar-like shaped electrodes,
    12 cm interval: 5 bar-like shaped electrodes,
    10 cm interval: 5 bar-like shaped electrodes,
    8 cm interval: 10 bar-like shaped electrodes,
    6 cm interval: 10 bar-like shaped electrodes, and
    4 cm interval: 15 bar-like shaped electrodes
  angle of each electrode to the transportation direction of the substrate: 90°
  interval between each adjacent electrodes (the distance in a horizontal direction from the center on the central axis of one bar-like shaped electrode to that of the other bar-like shaped electrode):
    10 cm
  substrate temperature: 300° C.
  deposited film thickness: 10 μm

COMPARATIVE EXAMPLE 2

The procedures of Example 5 were repeated, except that all the intervals of the 50 bar-like shaped electrodes to the long substrate were made to be 4 cm, to form a μc-Si series thin film.

Evaluation

For each of Example 5 and Comparative Example 2, evaluation was conducted with respect to profile of each of absorption coefficient, crystal volume fraction, and hydrogen content in depth direction in the same manner as in Example 1.

In the following, description will be made of the evaluated results.

With Respect to the Absorption Coefficient:

The absorption coefficient in Comparative Example 2 was found to be simply decreased. Particularly, the absorption coefficient of a portion (which is about 200 nm thick) corresponding to the initial deposition stage is small, and for the absorption thereafter, it well coincides with a model in which substantially constant absorption coefficient is assumed.

On the other hand, the absorption coefficient in Example 5 was found to be gradually increased. Specifically, it was found that the absorption coefficient is gradually enlarged as the film deposition proceeds.

With Respect to the Average Grain Size:

The evaluated results of this evaluation item are shown Table 4.

The following facts were found. That is, in Comparative Example 2, although an amorphous layer is present and the average grain size is gradually increased until near 200 nm from the substrate, the average grain size thereafter is substantially constant until near the surface.

On the other hand, in Example 5, substantially no amorphous layer is present in the state at the initial deposition stage, and the average grain size thereafter is gradually decreased toward near the surface.

With Respect to the Crystal Volume Fraction:

The evaluated results of this evaluation item are shown in Table 5. Based on the results shown in Table 5, it is understood that the crystal volume fraction in Comparative Example 2 is substantially constant until near the surface, but the crystal volume fraction in Example 5 is gradually decreased toward near the surface.

Figure 19:
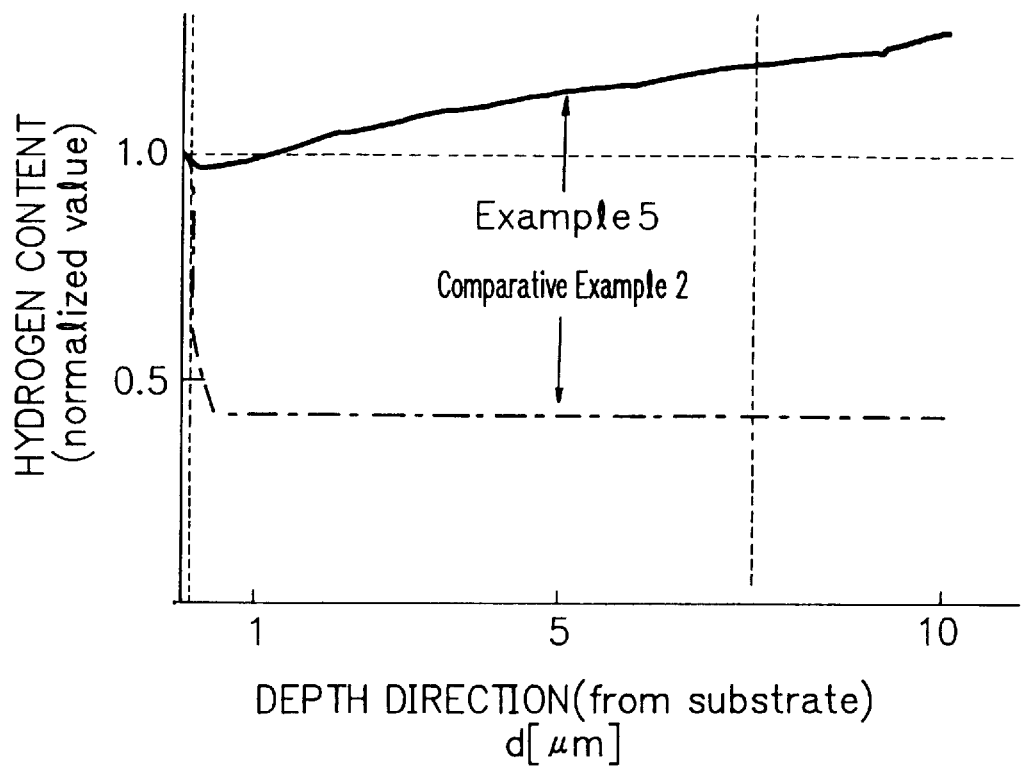

With Respect to the Hydrogen Content:

The evaluated results of this evaluation item are graphically shown in FIG. 19. Based on the results shown in FIG. 19, the following facts are understood. That is, in Comparative Example 2, a layer having a large hydrogen content is present until near 200 nm from the substrate, and although the hydrogen content thereafter is decreased, the successive hydrogen content is substantially constant until near the surface. On the other hand, in Example 5, although the hydrogen content in the state at the initial deposition stage is substantially constant, the hydrogen content thereafter is gradually increased toward near the surface.

Separately, in each of Example 5 and Comparative Example 2, there was prepared a photovoltaic element as well as in Experiment 3, wherein the formation of the p-type layer and the n-type layer was conducted under the same conditions employed for the formation of these layers in Experiment 3. For the resultant photovoltaic elements, evaluation with respect to initial photoelectric conversion efficiency and light degradation test were conducted in the same manner as in Experiment 3.

The results obtained are collectively shown in Table 6. Each value for Example 5 is a value relative to the corresponding value of Comparative Example 2 which is set at 1.00.

Based on the results shown in Table 6, it is understood that by using a μc-Si series thin film formed by using a plurality of bar-like shaped electrodes arranged such that their intervals to a long substrate are widened in the upper side of the transportation direction of the long substrate and narrowed in the down side thereof, it is possible to prepare a photovoltaic element which is superior in photovoltaic element characteristics.

EXAMPLE 6

Figure 20:
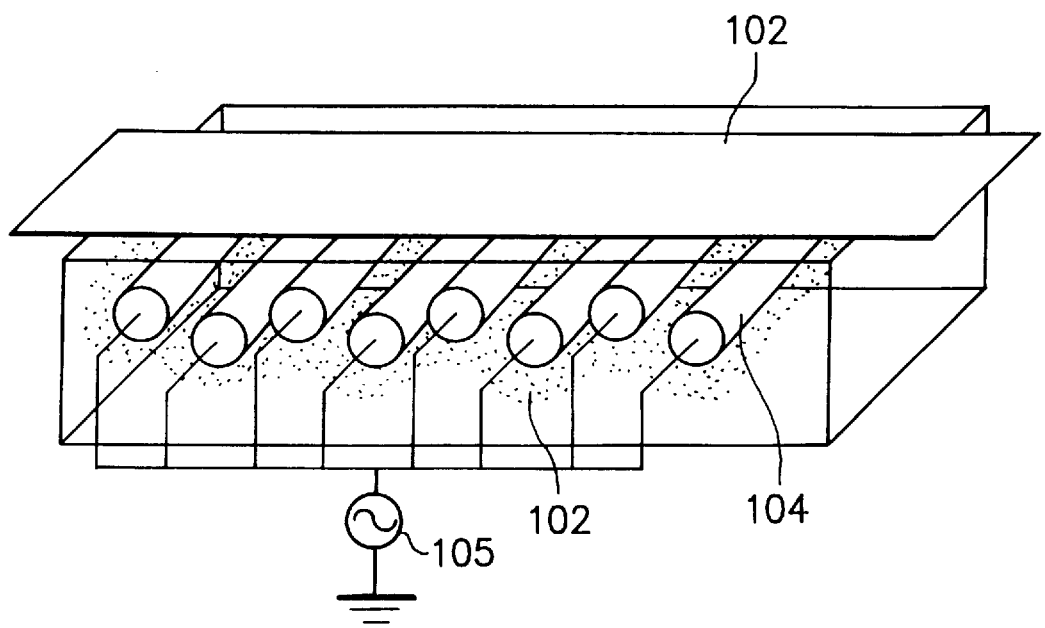

As the bar-like shaped electrode 104 in the film-forming apparatus shown in FIG. 1, as shown in FIG. 20 (which is a conceptual diagram which is not always in agreement with actual experimental conditions), a plurality of bar-like shaped electrodes 104 each being the same as the bar-like shaped electrode 104 used in Experiment 1 were arranged such that they are perpendicular to a normal line of a long substrate 102 and their intervals to the long substrate are partially periodically changed to the transportation direction of the long substrate.

Using the apparatus thus constituted, a μc-Si series thin film was formed under such conditions as will be described below.

As the long substrate 102, there was used a stainless steel SUS430BA web of 0.2 mm in thickness, 20 cm in width and 50 m in length having a 1 μm thick zinc oxide (ZnO) film formed thereon. The formation of μc-Si series thin film was conducted in accordance with the procedures in Experiment 1, except for changing the film-forming conditions in Experiment 1 to those below mentioned.

Film-Forming Conditions:
- raw material gas (SiH$_4$): 50 sccm
- dilution gas (i): 2000 sccm
- oscillation frequency: 200 MHz
- high frequency power: 10 W/cm$^2$
- inner pressure in the deposition chamber: $2.7 \times 10^{-1}$ Pa
- intervals of the electrodes to the long substrate (from the upper side of the substrate transportation direction):
  - 15 cm interval: 5 bar-like shaped electrodes,
  - 12 cm interval: 5 bar-like shaped electrodes,
  - 4 cm interval: 10 bar-like shaped electrodes,
  - 8 cm interval: 10 bar-like shaped electrodes,
  - 4 cm interval: 10 bar-like shaped electrodes, and
  - 8 cm interval: 10 bar-like shaped electrodes
- angle of each electrode to the transportation direction of the substrate: 90°
- interval between each adjacent electrodes (the distance in a horizontal direction from the center on the central axis of one bar-like shaped electrode to that of the other bar-like shaped electrode):
  - 10 cm
- substrate temperature: 300° C.
- deposited film thickness: 10 μm Evaluation For Example 6, evaluation was conducted with respect to profile of each of absorption coefficient, crystal volume fraction, and hydrogen content in depth direction in the same manner as in Example 1.

In the following, description will be made of the evaluated results.

With Respect to the Absorption Coefficient:

The absorption coefficient in Example 6 was found to be periodically changed such that its increase and decrease are repeated. Specifically, it was found that the absorption coefficient is periodically changed as the film deposition proceeds.

With Respect to the Average Grain Size:

The evaluated results of this evaluation item are shown Table 7.

In Example 6, substantially no amorphous layer was present in the state at the initial deposition stage, and the average grain size thereafter was periodically changed such that it was increased and decreased toward near the surface.

With Respect to the Crystal Volume Fraction:

The evaluated results of this evaluation item are shown in Table 8. Based on the results shown in Table 8, it is understood that the crystal volume fraction in Example 6 is periodically changed such that it is increased and decreased toward near the surface.

Figure 21:
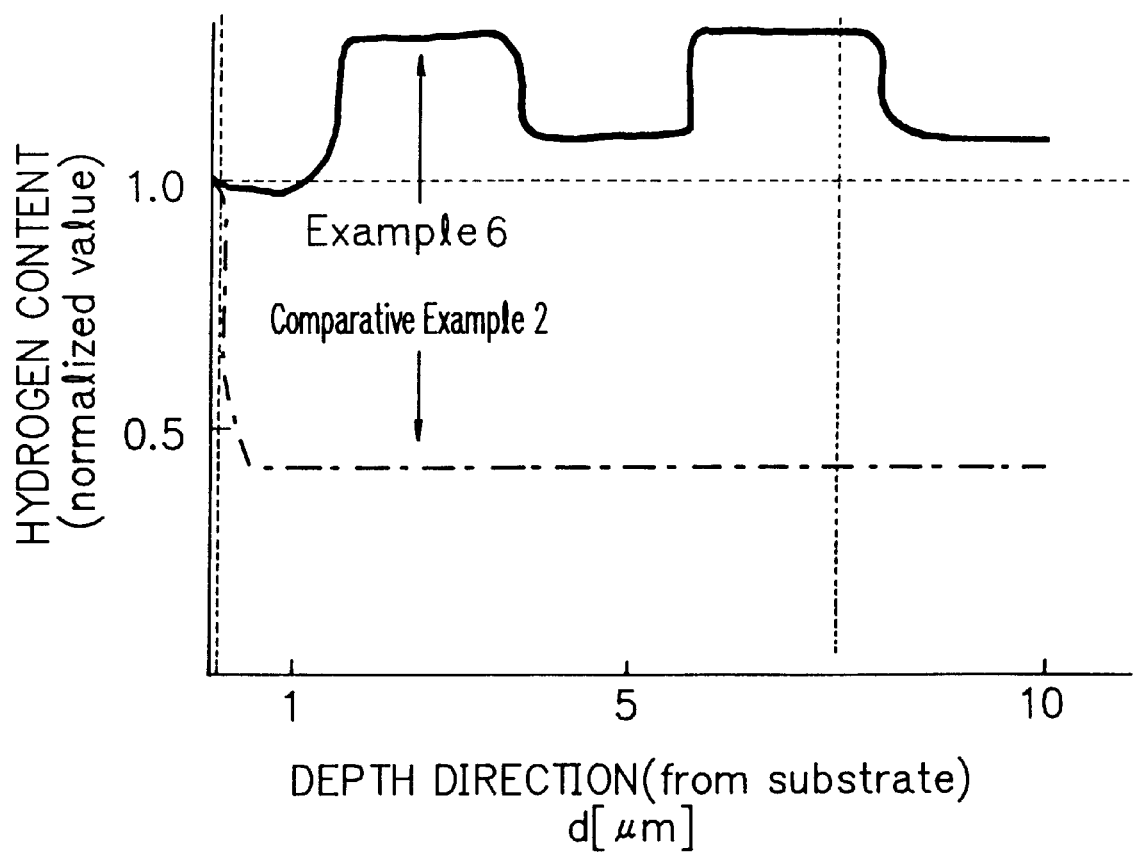

With Respect to the Hydrogen Content:

The evaluated results of this evaluation item in Example 6 are graphically shown in FIG. 21, in which the evaluated results of this evaluation item obtained in Comparative Example 2 are together shown. Based on the results shown in FIG. 21, the following facts are understood. That is in Example 6, although the hydrogen content in the state at the initial deposition stage is substantially constant, the hydrogen content thereafter is periodically changed such that it is increased and decreased toward near the surface.

From the above results, it is understood that according to the process of Example 6, it is possible to readily form a μc-Si series thin film whose absorption coefficient is periodically changed toward the film thickness direction.

Separately, in Example 6, there was prepared a photovoltaic element as well as in Experiment 3, wherein the formation of the p-type layer and the n-type layer was conducted under the same conditions employed for the formation of these layers in Experiment 3. For the resultant photovoltaic element, evaluation with respect to initial photoelectric conversion efficiency and light degradation test were conducted in the same manner as in Experiment 3.

The results obtained are collectively shown in Table 9, in which the evaluated results of the photovoltaic element in Comparative Example 2 are together shown. Each value for Example 6 is a value relative to the corresponding value of Comparative Example 2 which is set at 1.00.

Based on the results shown in Table 9, it is understood that by using a μc-Si series thin film formed by using a plurality of bar-like shaped electrodes arranged such that their intervals to a long substrate are periodically changed to the transportation direction of the long substrate, it is possible to prepare a photovoltaic element which is superior in photovoltaic element characteristics.

As will be understood from the above description, according to the process of the present invention, it is possible to readily control the properties of a μc-Si series thin film in the film thickness direction by a simple manner. And it is possible to readily form a high duality μc-Si series thin film excelling in properties and which has a graded film property in the film thickness direction. In addition, by using such μc-Si series thin film, it is possible to produce a high quality microcrystal semiconductor device at a reasonable production cost.

TABLE 1

| interval between substrate and electrode (cm) | initial photoelectric conversion efficiency | degradation test |
| --- | --- | --- |
| 0.5 | 0.80 | 0.85 |
| 0.8 | 0.90 | 0.95 |
| 1.0 | 0.95 | 0.97 |
| 2.0 | 0.97 | 0.99 |
| 5.0 | 1.00 | 1.00 |
| 8.0 | 1.05 | 1.03 |
| 10 | 1.05 | 1.03 |
| 20 | 1.05 | 1.03 |

TABLE 2

| | depth direction (from substrate) (μm) | | | | |
| --- | --- | --- | --- | --- | --- |
| average grain size | 1 | 3 | 5 | 7 | 9 |
| Example 1 | 1.00 | 1.10 | 1.20 | 1.10 | 1.05 |
| Comparative Example 1–2 | 1.00 | 1.00 | 1.00 | 1.00 | 1.00 | normalized values when the value of the 1 μm thick depth is set at 1.00

TABLE 3

| | depth direction (from substrate) ($\mu$m) | | | | |
|---|---|---|---|---|---|
| crystal volume fraction | 1 | 3 | 5 | 7 | 9 |
| Example 1 | 1.00 | 1.08 | 1.20 | 1.10 | 1.6 |
| Comparative Example 1–2 | 1.00 | 1.00 | 1.00 | 1.00 | 1.00 | normalized values when the value of the 1 $\mu$m thick depth is set at 1.00

TABLE 4

| | depth direction (from substrate) ($\mu$m) | | | | |
|---|---|---|---|---|---|
| average grain size | 1 | 3 | 5 | 7 | 9 |
| Example 5 | 1.00 | 0.96 | 0.92 | 0.90 | 0.84 |
| Comparative Example 2 | 1.00 | 1.00 | 1.00 | 1.00 | 1.00 | normalized values when the value of the 1 $\mu$m thick depth is set at 1.00

TABLE 5

| | depth direction (from substrate) ($\mu$m) | | | | |
|---|---|---|---|---|---|
| crystal volume fraction | 1 | 3 | 5 | 7 | 9 |
| Example 5 | 1.00 | 0.97 | 0.93 | 0.89 | 0.83 |
| Comparative Example 2 | 1.00 | 1.00 | 1.00 | 1.00 | 1.00 | normalized values when the value of the 1 $\mu$m thick depth is set at 1.00

TABLE 6

| | initial photoelectric conversion efficiency | degradation test |
|---|---|---|
| Example 5 | 1.12 | 1.09 |
| Comparative Example 2 | 1.00 | 1.00 |

TABLE 7

| | depth direction (from substrate) ($\mu$m) | | | | |
|---|---|---|---|---|---|
| average grain size | 1 | 3 | 5 | 7 | 9 |
| Example 6 | 1.00 | 0.80 | 0.93 | 0.82 | 0.94 | normalized values when the value of the 1 $\mu$m thick depth is set at 1.00

TABLE 8

| | depth direction (from substrate) ($\mu$m) | | | | |
|---|---|---|---|---|---|
| crystal volume fraction | 1 | 3 | 5 | 7 | 9 |
| Example 6 | 1.00 | 0.84 | 0.90 | 0.79 | 0.92 | normalized values when the value of the 1 $\mu$m thick depth is set at 1.00

TABLE 9

| | initial photoelectric conversion efficiency | degradation test |
|---|---|---|
| Example 6 | 1.05 | 1.11 |
| Comparative Example 2 | 1.00 | 1.00 |

What is claimed is:

1. A process for forming a microcrystalline silicon series thin film with a plasma CVD process, comprising arranging a substrate in a vacuum chamber, so as to oppose an electrode provided in said vacuum chamber, and while transporting said substrate, causing a glow discharge between said electrode and said substrate to deposit said microcrystalline silicon series thin film on said substrate, wherein a plurality of bar-shaped electrodes as said electrode are arranged such that they are perpendicular to a normal line of said substrate and their intervals to said substrate are all different or in part different, and said glow discharge is caused using a high frequency power with an oscillation frequency in a range of from 50 MHz to 550 MHz.

2. A process according to claim 1, wherein said plurality of bar-shaped electrodes are arranged such that they are parallel to each other.

3. A process according to claim 1, wherein said plurality of bar-shaped electrodes are arranged such that they are perpendicular to a direction the substrate is transported.

4. A process according to claim 1, wherein said plurality of bar-shaped electrodes are arranged such that their intervals to the substrate are greater where the depositing begins on the substrate and smaller where the depositing has progressed on the substrate.

5. A process according to claim 1, wherein said plurality of bar-shaped electrodes are arranged such that their intervals to the substrate alternate in a periodic arrangement in a direction the substrate is transported.

* * * * *

UNITED STATES PATENT AND TRADEMARK OFFICE
CERTIFICATE OF CORRECTION

PATENT NO. : 6,645,573 B2
DATED : November 11, 2003
INVENTOR(S) : Makoto Higashikawa et al.

It is certified that error appears in the above-identified patent and that said Letters Patent is hereby corrected as shown below:

Column 2,
Line 3, "Cont." should read -- Conf. --;
Line 46, "there is a report" should be deleted;
Line 47, "in that" should be deleted; and
Line 48, "region hitherto, discussion has been made by" should read -- region, --.

Column 3,
Line 38, "occur" should read -- occur, --.

Column 4,
Line 16, "is film-forming" should read -- is an undeveloped film-forming --;
Line 28, "n" should read -- in --.

Column 7,
Line 5, "inventors," should read -- inventors --;
Line 35, "(μc-Si);" should read -- (μc-Si), --; and
Line 59, "position the" should read -- position, the --.

Column 8,
Line 36, "to be" should read -- is to be --;
Line 47, "it, desired" should read -- it is desired --; and
Line 50, "factor (2);" should read -- factor (2), --.

Column 9,
Line 20, "bar-line" should read -- bar-like --.

Column 10,
Line 47, "is" should be deleted; and
Line 49, "form an" should read -- form, an --.

Column 11,
Line 41, "$SiHD_2D_2$," should read -- $SiH_2D_2$, --;
Line 42, "$(SiF_2)$," should read -- $(SiF_2)_4$, --;
Line 44, "$SiH_4Br_2$," should read -- $SiH_2Br_2$, --;
Line 49, "$C_nH_{2n-2}$" should read -- $C_nH_{2n+2}$, --; and
Line 54, "$N_3$," should read -- $NH_3$, --.

UNITED STATES PATENT AND TRADEMARK OFFICE
CERTIFICATE OF CORRECTION

PATENT NO. : 6,645,573 B2
DATED : November 11, 2003
INVENTOR(S) : Makoto Higashikawa et al.

It is certified that error appears in the above-identified patent and that said Letters Patent is hereby corrected as shown below:

Column 14,
Line 9, "a" should read -- at --;
Line 38, "2000scam" should read -- 2000 sccm --; and
Line 45, Close up left on margin.

Column 15,
Line 31, "based-on" should read -- based on --; and
Line 48, "was" should read -- was first --.

Column 16,
Line 12, "the," should read -- the --;
Line 20, "this: -experiment" should read -- this experiment --.

Column 17,
Line 34, "bye" should read -- by --.

Column 18,
Line 8, "conduct ed" should read -- conducted --.

Column 19,
Line 66, "mass:" should read -- mass --.

Column 20,
Line 31, "part-of" should read -- part of --.

Column 21,
Line 10, "series," should read -- series --;
Line 39, "procedure" should read -- procedures --; and
Line 64, "which," should read -- which --.

Column 22,
Line 8, "steel" should read -- stainless steel --; and
Line 9, "in 50 m" should read -- in width and 50 m --.

UNITED STATES PATENT AND TRADEMARK OFFICE
CERTIFICATE OF CORRECTION

PATENT NO. : 6,645,573 B2
DATED : November 11, 2003
INVENTOR(S) : Makoto Higashikawa et al.

It is certified that error appears in the above-identified patent and that said Letters Patent is hereby corrected as shown below:

Column 25,
Line 10, "gas (i):" should read -- gas ($H_2$): --; and
Line 52, "Example6," should read -- Example 6, --.

Column 26,
Line 1, "is in" should read -- is, in --.

Signed and Sealed this

First Day of June, 2004

JON W. DUDAS
*Acting Director of the United States Patent and Trademark Office*